(12) United States Patent
Walther et al.

(10) Patent No.: US 12,164,410 B2
(45) Date of Patent: *Dec. 10, 2024

(54) AUTONOMOUS VEHICLE TESTING SYSTEMS AND METHODS

(71) Applicant: Aurora Operations, Inc., Pittsburgh, PA (US)

(72) Inventors: Charly Mario Walther, Tokyo (JP); Nathan Steven Appelson, Pittsburgh, PA (US); Jeffrey Allen Howell, Pittsburgh, PA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/567,231

(22) Filed: Jan. 3, 2022

(65) Prior Publication Data

US 2022/0121550 A1  Apr. 21, 2022

Related U.S. Application Data

(63) Continuation of application No. 16/784,408, filed on Feb. 7, 2020, now Pat. No. 11,216,355, which is a (Continued)

(51) Int. Cl.
    *G06F 11/34* (2006.01)
    *G06F 11/30* (2006.01)

(52) U.S. Cl.
    CPC ...... *G06F 11/3457* (2013.01); *G06F 11/3013* (2013.01)

(58) Field of Classification Search
    CPC ............. G06F 11/3457; G06F 11/3013; G06F 11/2273; G06F 30/15; G06F 30/20; G06F 11/2268
    See application file for complete search history.

(56) References Cited

U.S. PATENT DOCUMENTS 10,599,546 B1 * 3/2020 Walther .............. G06F 11/3457
2017/0132117 A1 * 5/2017 Stefan ................. G06F 11/3684
(Continued)

OTHER PUBLICATIONS

Husel et al., Asynchronous Real-Time Framework for Knowledge-Based Intersection Assistance, Oct. 5-7, 2011, 14th International IEEE Conference on Intelligent Transportation Systems, Washington, DC, pp. 1680-1685 (Year: 2011).*
Vishnukumar et al., Machine Learning and Deep Neural Network—Artificial Intelligence Core for Lab and Real-World Test and Validation for ADAS and Autonomous Vehicles, Intelligent Systems Conference, Sep. 7-8, 2017, London, England, 8 pp. (Year: 2017).*
Hulsen et al., Asynchronous Real-Time Framework for Knowledge-Based Intersection Assistance, Oct. 5-7, 2011, 14$^{th}$ International IEEE Conference on Intelligent Transportation Systems, Washington, DC, pp. 1680-1685 (Year:2021).
(Continued)

*Primary Examiner* — John C Kuan
(74) *Attorney, Agent, or Firm* — Dority & Manning, P.A.

(57) ABSTRACT

Systems and methods for autonomous vehicle testing are provided. In one example embodiment, a computer-implemented method includes obtaining, by a computing system, data indicative of a test of an autonomous vehicle computing system. The method can include determining, by the computing system, one or more autonomous vehicle capabilities that are tested by the test. The method includes determining, by the computing system, a testing scenario that corresponds to the test. The testing scenario can generated at least in part using real-world data. The method includes associating, by the computing system, the data indicative of the test with data indicative of the one or more autonomous vehicle capabilities that are tested by the test and data indicative of the testing scenario. The method includes storing such associated data in in an accessible memory.

20 Claims, 8 Drawing Sheets

Related U.S. Application Data continuation of application No. 15/807,893, filed on Nov. 9, 2017, now Pat. No. 10,599,546.

(60) Provisional application No. 62/576,844, filed on Oct. 25, 2017.

(56) References Cited

U.S. PATENT DOCUMENTS

| | | | | |
|---|---|---|---|---|
| 2017/0132334 | A1* | 5/2017 | Levinson | G01S 17/931 |
| 2017/0139411 | A1* | 5/2017 | Hartung | H04L 12/40 |
| 2018/0107770 | A1* | 4/2018 | Cahoon | G06F 11/3684 |
| 2021/0116256 | A1* | 4/2021 | Konrardy | G05B 23/0245 |
| 2022/0005291 | A1* | 1/2022 | Konrardy | B60W 60/0015 |

OTHER PUBLICATIONS

Madrigal, "Inside Waymo's Secret World for Training Self-Driving Cars", The Atlantic, Aug. 23, 2017, 32 pages.
Vishnukumar et al, "Machine Learning and Deep Neural Network—Artificial Intelligence Core for Lab and Real-World Test and Validation for ADAS and Autonomous Vehicles", Intelligent Systems Conference, Sep. 7-8, 2017, London, England, 8 pages.
IEEE Search Results, Mar. 19, 2021, 1 pp. (Year: 2021).
IEEE Xplore Search Results, Aug. 11, 2021, 1 pp. (Year:2021).

* cited by examiner

AUTONOMOUS VEHICLE TESTING SYSTEMS AND METHODS

PRIORITY CLAIM

The present application is based on and claims priority to U.S. application Ser. No. 16/784,408 having a filing date of Feb. 7, 2020, which claims the benefit of priority to U.S. application Ser. No. 15/807,893 having a filing date of Nov. 9, 2017 and issued as U.S. Pat. No. 10,599,546, which claims the benefit of U.S. Provisional Application No. 62/576,844 having a filing date of Oct. 25, 2017. Applicant claims priority to and the benefit of each of such applications and incorporates all such applications herein by reference in their entirety.

FIELD

The present disclosure relates generally to testing the computing systems of an autonomous vehicle.

BACKGROUND

An autonomous vehicle is a vehicle that is capable of sensing its environment and navigating without human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can navigate through such surrounding environment.

SUMMARY

Aspects and advantages of embodiments of the present disclosure will be set forth in part in the following description, or may be learned from the description, or may be learned through practice of the embodiments.

One example aspect of the present disclosure is directed to a computer-implemented method. The method includes obtaining, by a computing system that includes one or more computing devices, data indicative of a test of an autonomous vehicle computing system. The method includes determining, by the computing system, one or more autonomous vehicle capabilities that are tested by the test. The method includes determining, by the computing system, a testing scenario that corresponds to the test. The testing scenario is generated at least in part using real-world data. The method includes associating, by the computing system, the data indicative of the test with data indicative of the one or more autonomous vehicle capabilities that are tested by the test and data indicative of the testing scenario. The method includes storing, by the computing system in an accessible memory, the data indicative of the test associated with the data indicative of the testing scenario and the data indicative of the one or more autonomous vehicle capabilities that are tested by the test.

Another example aspect of the present disclosure is directed to a computing system for autonomous vehicle testing. The computing system comprising one or more processors and one or more tangible, non-transitory, computer readable media that collectively store instructions that when executed by the one or more processors cause the computing system to perform operations. The operations include obtaining data indicative of a test of an autonomous vehicle computing system. The operations include determining one or more autonomous vehicle capabilities that are tested by the test. The operations include determining a testing scenario that corresponds to the test. The testing scenario is generated at least in part using real-world data. The operations include associating the data indicative of the test with data indicative of the one or more autonomous vehicle capabilities that are tested by the test and data indicative of the testing scenario. The operations include storing, in an accessible memory, the data indicative of the test associated with the data indicative of the testing scenario and the data indicative of the one or more autonomous vehicle capabilities that are tested by the test.

Yet another example aspect of the present disclosure is directed to one or more tangible, non-transitory computer-readable media storing computer-readable instructions that when executed by one or more processors cause the one or more processors to perform operations. The operations include obtaining data indicative of a test of an autonomous vehicle computing system. The operations include determining one or more autonomous vehicle capabilities that are tested by the test. The operations include determining a testing scenario that corresponds to the test. The testing scenario is generated at least in part using real-world data. The operations include associating the data indicative of the test with data indicative of the one or more autonomous vehicle capabilities that are tested by the test and data indicative of the testing scenario. The operations include storing, in an accessible memory, the data indicative of the test associated with the data indicative of the testing scenario and the data indicative of the one or more autonomous vehicle capabilities that are tested by the test.

Other example aspects of the present disclosure are directed to systems, methods, vehicles, apparatuses, tangible, non-transitory computer-readable media, and memory devices for autonomous vehicle testing.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
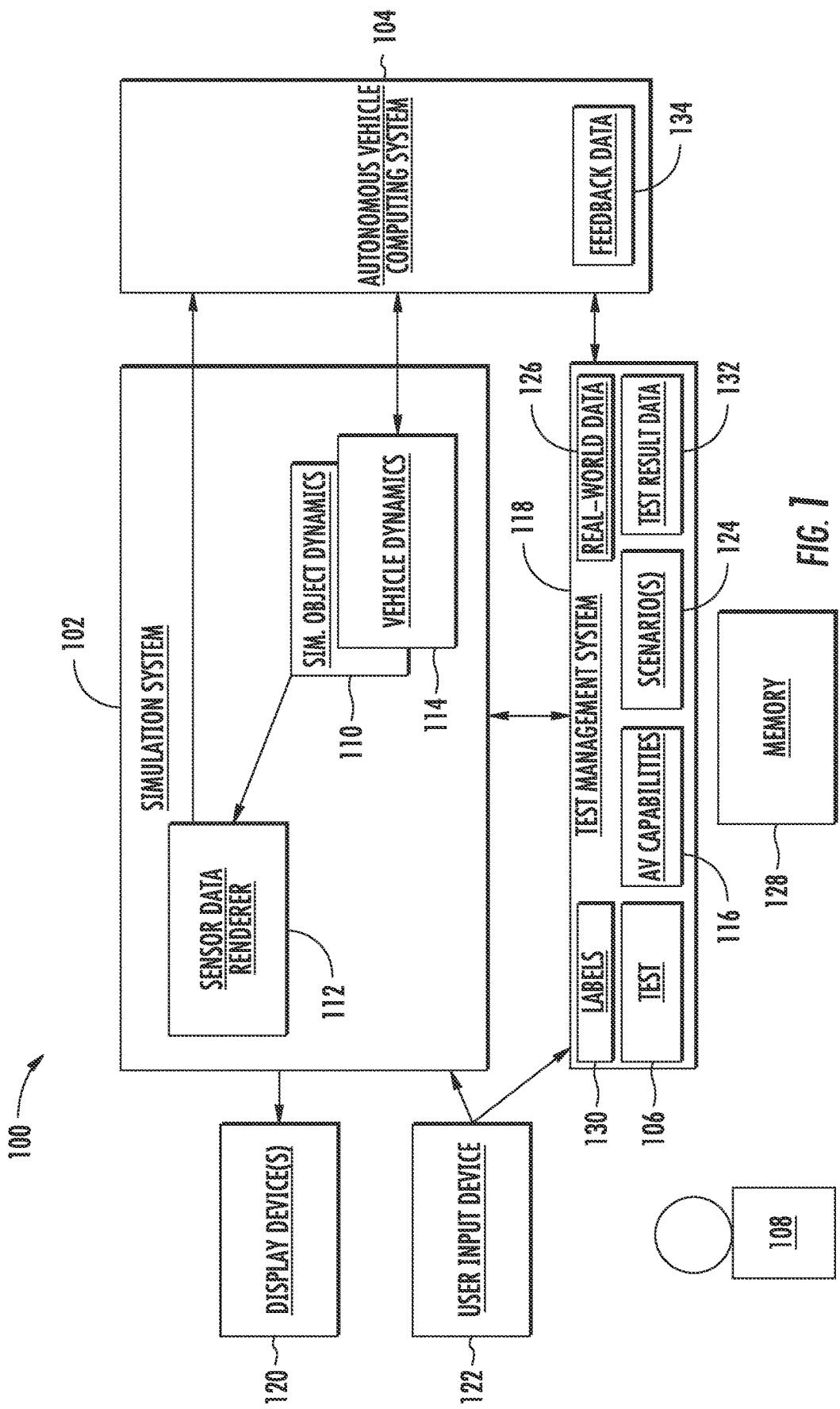
FIG. 1 depicts an example testing system according to example embodiments of the present disclosure.

Reference now will be made in detail to embodiments, one or more example(s) of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to improving the efficiency of autonomous vehicle testing. For instance, an autonomous vehicle can be a vehicle that can drive, navigate, operate, etc. with little to no human input. To do so, the autonomous vehicle can include an autonomous vehicle computing system containing an autonomy software stack. The autonomy software stack can enable the autonomous vehicle to perceive object(s) within its surrounding environment, predict the motion of those objects, and plan the motion of the autonomous vehicle, accordingly. To help improve system functionality and software capabilities, the autonomous vehicle computing system can be tested. Such tests can be conducted using an offline simulated environment and/or by deploying an autonomous vehicle on a test track.

The systems and methods of the present disclosure provide improved systems and methods for managing and implementing these autonomous vehicle tests. For instance, a user can configure a test by creating a testing environment (e.g., simulated environment, test track environment, etc.) in which an autonomous vehicle (e.g., simulated vehicle, real vehicle, etc.) will operate in accordance with the autonomous vehicle computing system. A testing system can acquire data indicative of the test and determine a corresponding testing scenario as well as one or more autonomous vehicle capabilities that are evaluated by the test. An autonomous vehicle capability can include a function, feature, behavior, etc. of the autonomous vehicle and its autonomy stack (e.g., that is being examined by the test). The testing scenario can be a situation used to test the one or more autonomous vehicle capabilities. The testing scenario can indicate testing parameters such as the type of geographic area represented in the testing environment, object(s) in the testing environment (e.g., vehicles, bicycles, pedestrians, etc.), weather condition(s), etc. These testing parameters can be determined based on real-world data (e.g., driving log data, sensor data, etc.), as further described herein. An individual test can be a variation of the testing scenario that evaluates the one or more autonomous vehicle capabilities. By way of example, an autonomous vehicle capability can include the performance of a left turn. The testing scenario can include the left turn at a four-way intersection with two moving objects. The test can include the left turn, at the four-way intersection, with two moving objects, where one object is moving at thirty-five miles per hour (mph) and one object is moving at forty-five mph. The testing system can associate data indicative of the test to a corresponding testing scenario as well as the autonomous vehicle capabilities being tested and store such data in a searchable database. In this way, the testing system and/or a subsequent user can more readily determine performance progress, as well as search, retrieve, review, and/or re-run the tests to verify autonomy software (e.g., newer versions of the software) without having to fully re-create new tests. This can save a significant amount of the computational resources (e.g., processing, memory, bandwidth, etc.) utilized by the testing system.

More particularly, an autonomous vehicle testing system can be configured to test the abilities of an autonomous vehicle. The testing system can include, for example, a simulation system, a test management system, and an autonomous vehicle computing system. The autonomous vehicle computing system can be communicatively coupled with the simulation system and/or test management system (e.g., via one or more wired and/or wireless networks). The autonomous vehicle computing system can include an offline computing system that includes the autonomy software similar to that on an autonomous vehicle (e.g., a model of the vehicle's computing system). In some implementations, the autonomous vehicle computing system can include additional simulation tasks running to fill any necessary gaps of not running on the actual vehicle, if needed. The testing system (e.g., a test management system) can configure a test for the autonomous vehicle computing system using a variety of test modalities.

In some implementations, a test can be based on previously collected driving logs that were acquired from one or more autonomous vehicles deployed in the real-world. For such log-based testing, the testing system and/or a user can select driving log data (and/or a section thereof) associated with an event that occurred in the real-world. This can include, for example, a situation in which an operator of the autonomous vehicle took over control of the autonomous vehicle (e.g., to make a left turn at a certain intersection). The sensor data acquired by the autonomous vehicle in this situation can then be used as an input into an autonomous vehicle computing system in an offline test to examine the autonomy system software (e.g., in order to develop software capable of handling the left turn). For example, the sensor data can be utilized as an input to the autonomy system software to control a simulated autonomous vehicle (e.g., in accordance with the objects indicated by the sensor data).

In some implementations, a test can be based on a full simulation. For such sim-based testing, the testing system can create a simulated environment in which a simulated autonomous vehicle operates (e.g., as controlled by the autonomous vehicle computing system). The testing system can obtain data indicative of one or more initial inputs associated with the simulated environment to help configure the test. For example, a user can specify (e.g., via one or more user input devices) various characteristics of the simulated environment that include, for example: a general type of geographic area for the simulated environment (e.g., highway, urban, rural, etc.); a specific geographic area for the simulated environment (e.g., beltway of City A, downtown of City B, countryside of County C, intersection of Street D and E in City F, etc.); one or more geographic features (e.g., trees, benches, obstructions, buildings, boundaries, exit ramps, etc.) and their corresponding positions in the simulated environment; a time of day; one or more weather conditions; one or more simulated objects within the simulated environment (e.g., initial position, heading, speed, etc.); a type of each simulated object (e.g., vehicle, bicycle, pedestrian, etc.); a geometry of each simulated object (e.g., shape, size etc.); the motion of the simulated object(s), if any (e.g., an assigned motion trajectory for an actor object, a designation as a static object, etc.); one or more operating conditions of each simulated object (e.g., correct turn signal usage vs. no turn signal usage, functional brake lights vs. one or more brake lights that are non-functional, etc.); one or more initial conditions of the simulated autonomous vehicle within the simulated environment (e.g., initial position, heading, speed, etc.); a type of the simulated autonomous vehicle (e.g., sedan, sport utility, etc.); a geometry of the simulated autonomous vehicle (e.g., shape, size etc.); and/or other data associated with the simulated environment. The testing system can obtain the data indicative of these initial input(s) and generate the simulated environment accordingly. In some implementations, one or more templates can be available for selection, which provide a standardized or otherwise pre-configured simulated environment and the user can select one of the templates and optionally modify the template environment with additional user input. The autonomous vehicle computing system can be configured to control a simulated autonomous vehicle within a simulated environment and provide, to the testing system, feedback data indicative of the operations of the autonomous vehicle computing system (e.g., data indicative of the operations of the autonomy software stack as the simulation runs), as further described herein. The testing system (e.g., the simulation system) can to run the test with simulated objects and the simulated autonomous vehicle within the testing environment.

In some implementations, the test can include the deployment of an autonomous vehicle within a test track environment. For instance, the test track environment can include, for example, a closed course testing environment (e.g., a ground test track, etc.) and/or another testing environment used to test the functions of the autonomous vehicle computing system onboard the autonomous vehicle (e.g., and the associated onboard autonomy software stack). The testing environment can include travel ways (e.g., roads, intersections, roundabouts, etc.) for the autonomous vehicle to travel. Testing coordinators can configure the testing environment to test the performance of the autonomous vehicle in accordance with a test plan. For example, the test can be configured to examine the autonomous vehicle's ability to predict the motion of certain objects within the vehicle's testing environment, generate vehicle motion plans, implement vehicle motion plans, and/or other autonomous operations. The autonomous vehicle computing system can be configured to provide, to the testing system, feedback data indicative of the operations of the autonomous vehicle computing system that are performed to navigate the test track environment.

The testing system (e.g., a test management system) can determine one or more autonomous vehicle capabilities that are tested by the test. An autonomous vehicle capability can be a feature, function, and/or behavior of the autonomous vehicle. This can include a capability that the autonomous vehicle is expected to be able to perform and/or a capability that is being developed. The autonomous vehicle capabilities can include, for example: speed limits and directions (e.g., conformity to specified speed limits, directions of travel, lane restrictions, etc.); stop and go traffic (e.g., ability to properly handle dense traffic conditions with frequent slow-downs, starts, stops, etc.); turning (e.g., ability to handle left hand turns, unprotected turns, three point turns, U-turns, etc.); parallel parking; navigating certain geographic features (e.g., crossing train tracks); traveling in reverse (e.g., backing into a parking space); signaling (e.g., handling turn signal(s) from other objects); nudging; handling jaywalkers; and/or other capabilities of an autonomous vehicle. The autonomous vehicle capabilities can be included in a pre-defined group (e.g., list, table, etc.) of autonomous vehicle capabilities and/or created as a new capability. In some implementations, an autonomous vehicle capability can depend on another autonomous vehicle capability. For example, the autonomous vehicle's ability to handle stop-and-go traffic can depend on its ability to handle speed limits and direction. If tests associated with speed limits and directions fail, then failures of tests associated with stop-and-go traffic may be less meaningful.

In some implementations, the testing system can determine which autonomous vehicle capabilities are tested by the test based at least in part on user input. By way of example, the testing system can provide a user interface (e.g., via one or more display devices) for a user (e.g., test operator). The user interface can present the one or more autonomous vehicle capabilities for selection by the user (e.g., via a check box, drop down menu, etc.) and/or can present an interactive element (e.g., text entry box, etc.) via which the user can define a new autonomous vehicle capability. The testing system can obtain data indicative of user input that identifies the one or more autonomous vehicle capabilities and determine that these capabilities are being tested based on such user input data.

Additionally or alternatively, the testing system can automatically determine which autonomous vehicle capabilities are tested by the test. By way of example, the testing system can obtain data indicative of the test (e.g., driving logs, data indicative of a simulated environment, a test plan for test-track testing, etc.). The testing system can mine the testing data (e.g., metadata) to determine which autonomous vehicle capabilities are being tested by the test. For example, in the event that the testing environment includes a traffic-dense highway with objects (e.g., simulated vehicles) at various slow speeds and stopped positions, the testing system can determine that the test is evaluating the autonomous vehicle's ability to handle stop-and-go traffic (and/or any other interdependent capabilities).

The testing system can determine a testing scenario corresponding to the test. A testing scenario can be a situation used to test the one or more autonomous vehicle capabilities. The testing scenario can indicate one or more testing parameters of a test such as, for example: the type of geographic area represented in the testing environment (e.g., intersection, highway, cul-de-sac, dead end, etc.), features of the geographic area (e.g., train tracks, obstructions, etc.); one or more objects within the testing environment (e.g., vehicles, bicycles, pedestrians, etc.); weather condition(s), and/or other parameters. An individual test can be a variation of the testing scenario that evaluates the one or more autonomous vehicle capabilities. By way of example, the testing scenario can be a left turn at a four way intersection with two objects. The individual test can include the autonomous vehicle performing a left turn, at the four-way intersection, with two moving objects, where one object is moving at thirty-five mph (e.g., triggered at a first time, etc.) and one object is moving at forty-five mph (e.g., triggered at a second time, etc.). In some implementations, the testing scenario can be included in a plurality of testing scenarios (e.g., a set, etc.) that is grouped by the testing parameters. A testing scenario can be a pre-existing testing scenario and/or created as a new testing scenario.

The testing scenario can be generated at least in part using real-world data. For instance, the testing scenario can be based on a scenario that occurred in the real-world (e.g., while the autonomous vehicle was deployed outside of a testing environment). This can include, for example, a scenario in which a human operator of the autonomous vehicle assumed control of the autonomous vehicle. Additionally, or alternatively, this can include a scenario in which the autonomous vehicle adjusted its operating mode from a fully autonomous operating mode to another operating mode (e.g., semi-autonomous operating mode, manual operating mode, etc.) to allow a human operator to, at least partially, control the autonomous vehicle. By way of example, an autonomous vehicle within the real-world may have a human operator at least partially assume control of the autonomous vehicle to perform a certain unprotected left-turn at an intersection where there are several moving objects within the surrounding environment of the autonomous vehicle. The autonomous vehicle can generate and/or otherwise obtain real-world data associated with such a real-world scenario. For example, the autonomous vehicle can generate driving log data that is indicative of the parameters of the vehicle (e.g., location, speed, etc.) as well as the parameters of the real-world scenario (e.g., geographic area, objects, etc.). Additionally, or alternatively, the autonomous vehicle can acquire sensor data via one or more sensors (e.g., onboard the autonomous vehicle) associated with the surrounding environment of the real-world scenario before, during, and/or after the real-world scenario occurs. The sensor data can include, for example, image data (e.g., still image data, video image data), Light Detection and Ranging (LIDAR) data, Radio Detection and Ranging (RADAR) data, and/or other types of data.

The testing system can generate a testing scenario based at least in part on this real-world data. In some implementations, the testing system can obtain the real-world data (e.g., from a vehicle computing system, from another system that obtains and stores such data, etc.). The testing system can identify one or more testing parameters based at least in part on the real-world data. For example, the testing system can mine the real-world data to determine the type of geographic area represented in the real-world scenario, features of the geographic area, one or more objects within the surrounding environment, weather condition(s), and/or other testing parameters. The testing system can generate the testing scenario based at least in part on the identified testing parameters. In some implementations, a user can review the real-world data and provide user input indicative of the testing scenarios. The testing system can generate the testing scenario based at least in part on such user input.

In some implementations, the testing system can determine a testing scenario that corresponds to a test based at least in part on user input. By way of example, the testing system can provide a user interface for a user, as described herein. The user interface can present one or more testing scenarios for selection by the user (e.g., via a check box, drop down menu, etc.). The testing system can obtain data indicative of user input that identifies a testing scenario as corresponding to the test. Additionally or alternatively, the user interface can present an interactive element (e.g., text entry box, etc.) via which the user can define a new testing scenario. For example, the user can provide user input (e.g., via the user interface) indicating one or more testing parameters (e.g., four way intersection, two objects) and the testing system can generate a new testing scenario based at least in part on such user input.

Additionally or alternatively, the testing system can automatically determine which testing scenario corresponds to a test. By way of example, the testing system can obtain data indicative of the test (e.g., driving logs, data indicative of a simulated environment, a test plan for test track testing, etc.). The testing system can mine the testing data to determine the test's various testing parameters. For example, the testing system can determine that a testing environment includes a vehicle making a left turn at a four-way intersection with two objects. Accordingly, the testing system can determine that the testing scenario including a four-way intersection with two objects best corresponds to the test.

The testing system can associate data indicative of the test with data indicative of the one or more autonomous vehicle capabilities that are tested by the test and data indicative of the testing scenario. For instance, the testing system can associate these data sets to create an associated data structure that includes the data linked together and/or organized by references (e.g., links, pointers, tags, etc.). This can be done, for example, in response to user input selecting a testing scenario and one or more autonomous vehicle capabilities as being associated with the test. The testing system can associate the test with the one or more autonomous vehicle capabilities and the testing scenario so that a query for one or more of these elements (e.g., test, capabilities, testing scenario) will return a data structure indicative of all three. By way of example, a test can include an autonomous vehicle (e.g., simulated autonomous vehicle, real autonomous vehicle on a test track) making a left turn, at the four-way intersection, with two moving objects, where one object is moving at thirty-five miles per hour (mph) and one object is moving at forty-five mph. The testing system can associate this test with the autonomous vehicle capability of "performing a left turn" and a testing scenario of "four-way intersection, with two moving objects," such that data indicative of the test is linked to (and/or otherwise associated with) data indicative of the autonomous vehicle capability and data indicative of the testing scenario. In the event that a user later searches for tests that evaluate the ability of the autonomous vehicle to perform a left turn, the testing system (e.g., a test management system) can return at least this test and/or testing scenario as being associated with such an autonomous vehicle capability.

In some implementations, the testing system can associate a test with one or more labels. By way of example, the testing system can label (e.g., based on user input) a test (e.g., a test variation and/or a testing scenario as sound or unsound. A sound test (and/or a testing scenario) can designate a test variation (and/or a testing scenario) that is executable and that produces meaningful results when executed (e.g., produces valid results). An unsound test (and/or a testing scenario) can designate a test variation (and/or a testing scenario) that is not executable and/or that does not produce meaningful results when executed (e.g. produces invalid results). Additionally or alternatively, the testing system can label (e.g., based on user input) a test (e.g., test variation) and/or a testing scenario as in-scope or out-of-scope. An in-scope test (and/or a testing scenario) can designate a test (and/or a testing scenario) that the autonomous vehicle computing system (e.g., the tested software) is expected to pass. An out-of-scope test (and/or a testing scenario) can designate a test (and/or a testing scenario) that the autonomous vehicle computing system (e.g., the tested software) is not expected to pass. The scope and soundness of a test (and/or a testing scenario) can help determine whether a test (and/or a testing scenario) should be promoted (e.g., included in a group of tests (and/or a testing scenarios) that a software version is required to pass) or demoted (e.g., removed from a group of tests (and/or a testing scenarios) that a software version is required to pass). In some implementations, the testing system can include sets (e.g., tags, etc.) that identify various properties about a testing scenario (and/or allow user to do so). For example, a test variation and/or testing scenario can be included in a "golden set" indicative of required testing. In another example, a test variation and/or testing scenario can be included in a set in order to group together similar scenarios (e.g., scenarios in which pedestrians are wearing hats, holding umbrellas, pushing grocery carts, etc.).

The testing system can also associate test results with a test as well as its associated testing scenario and autonomous vehicle capabilities. For instance, an autonomous vehicle computing system can be configured to control a simulated autonomous vehicle within a simulated test environment and/or a real autonomous vehicle in a test track environment. The autonomous vehicle computing system can include an autonomy software stack that is the same as or at least similar to the software stack utilized outside of a testing environment. Additionally, or alternatively, the autonomy software stack utilized in the testing environment can include software (e.g., an updated version) that has not been deployed onto an autonomous vehicle. The autonomous vehicle computing system can perceive the testing environment, predict the motion of object(s) within the testing environment, and control the motion of the simulated or real autonomous vehicle accordingly. The testing system can obtain test result data based at least in part on these operations. For example, while and/or after the test is running, the testing system can obtain feedback data from the autonomous vehicle computing system (e.g., perception data, prediction data, motion planning data, etc. generated by the autonomy software stack). The testing system can evaluate the feedback data to determine whether the autonomous vehicle computing system properly perceived its testing environment, predicted object motion, appropriately planned vehicle motion, and satisfactorily performed the tested capabilities. The testing system can also associate the test result data with data indicative of the test, testing scenario, and/or one or more autonomous vehicle capabilities, as similarly described herein.

In some implementations, the testing system can be configured to determine a performance metric associated with the autonomous vehicle computing system. For instance, the testing system can obtain the test result data (e.g., including feedback data from the autonomous vehicle computing system). The testing system can determine a performance metric based at least in part on the test result data. For example, the performance metric can be indicative of the performance of the autonomous vehicle computing system (e.g., the software version being tested) for a test and/or testing scenario. The performance metric can indicate whether the autonomous vehicle computing system passed, failed, did not complete, etc. the test and/or testing scenario. In some implementations, the performance metric can be indicative of a score of the performance of the autonomous vehicle computing system with respect to a test and/or testing scenario. The performance metric can be determined for a plurality of tests associated with a testing scenario and/or an autonomous vehicle capability. In some implementations, the performance metric may be indicative of an aggregate performance of the autonomous vehicle computing system over a plurality of tests and/or testing scenarios. In some implementations, the testing system can provide for display data indicative of the performance metric via a user interface of a display device (e.g., for viewing by a user).

The testing system can store the associated data in an accessible memory such as, for example, a searchable database. For instance, the testing system can store (e.g., in the accessible memory) data indicative of the test associated with data indicative of the testing scenario, data indicative of the one or more autonomous vehicle capabilities that are tested by the test, and/or the associated test results. This can allow the testing system to quickly retrieve the associated data structure (e.g., linked data structure) from the accessible memory. For example, a user can provide (e.g., via user input to a user interface) a search query indicative of at least one of the test, the testing scenario, or the one or more autonomous vehicle capabilities. In response, the testing system can access the memory and present a user interface indicating the test, its associated testing scenario, the tested autonomous vehicle capabilities, and/or any test results. Moreover, the testing system can enable the user to modify and/or re-run the test (e.g., to test a newer software version) by providing user input to the user interface. Accordingly, the testing system can initiate any of the tests to obtain additional test result data.

The systems and methods described herein provide a number of technical effects and benefits. For instance, the present disclosure provides systems and methods for improved testing of autonomous vehicles. In particular, by associating tests with testing scenarios and the autonomous vehicle capabilities being tested in an accessible memory, the testing system (and/or a user thereof) can more easily search for and obtain data associated with a particular test, testing scenario, and/or tested capability. Additionally, this can allow the testing system (and the user) to better track the progress of the autonomous vehicle software and readily identify any scenarios and/or capabilities that need further testing. As such, the systems and methods provide a more efficient approach to autonomous vehicle software development and testing.

The systems and methods of the present disclosure also provide an improvement to vehicle computing technology, such as autonomous vehicle testing computing technology. In particular, a computing system (e.g., testing computing system) can obtain data indicative of a test of an autonomous vehicle computing system. The computing system can determine one or more autonomous vehicle capabilities that are tested by the test as well as a testing scenario that corresponds to the test. The testing scenario can be generated at least in part using real-world data (e.g., driving log data, LIDAR data, RADAR data, image data, etc.). The computing system can associate the data indicative of the test with data indicative of the one or more autonomous vehicle capabilities that are tested by the test and data indicative of the testing scenario. The computing system can store, in an accessible memory, the data indicative of the test associated with the data indicative of the testing scenario and the data indicative of the one or more autonomous vehicle capabilities that are tested by the test. In this way, the present disclosure provides a more computationally efficient autonomous vehicle testing computing system. For instance, associating and storing tests with testing scenarios and the autonomous vehicle capabilities being tested in an accessible memory can allow for more efficient storage and retrieval of autonomous vehicle test data. This can lead to less user input required to search such information (e.g., less user test entry, clicks, etc.) and significant savings in the processing and bandwidth resources required to retrieve such testing data. Moreover, the testing system and/or a user can more readily understand which tests/testing scenarios have been performed as well as these corresponding performance (e.g., via automatic determination of a performance metric). This can allow the testing system to recognize which tests to re-run and/or to modify, without the need for full test re-creation. Accordingly, the systems and methods of the present disclosure can lead to significant savings in the processing and memory resources utilized for test execution. Additionally, as described herein, the systems and methods allow for easier tracking of software development progress. This can lead to improved, more efficient software verification (e.g., using less computational resources), better autonomy software, and faster software deployment to an autonomous vehicle. Ultimately, the improved testing of the autonomous vehicle computing system as described herein can improve the ability of an autonomous vehicle to perceive its surrounding environment, predict object movement, plan vehicle motion, and safely navigate through the surrounding environment.

With reference now to the FIGS., example embodiments of the present disclosure will be discussed in further detail. FIG. 1 depicts an example autonomous vehicle testing system 100 according to example embodiments of the present disclosure. The testing system 100 can be configured to test the abilities of an autonomous vehicle. The testing system 100 can include, for example, a simulation system 102 and an autonomous vehicle computing system 104. The autonomous vehicle computing system 104 can be communicatively coupled with the simulation system 102 (e.g., via one or more wired and/or wireless networks).

Figure 2:
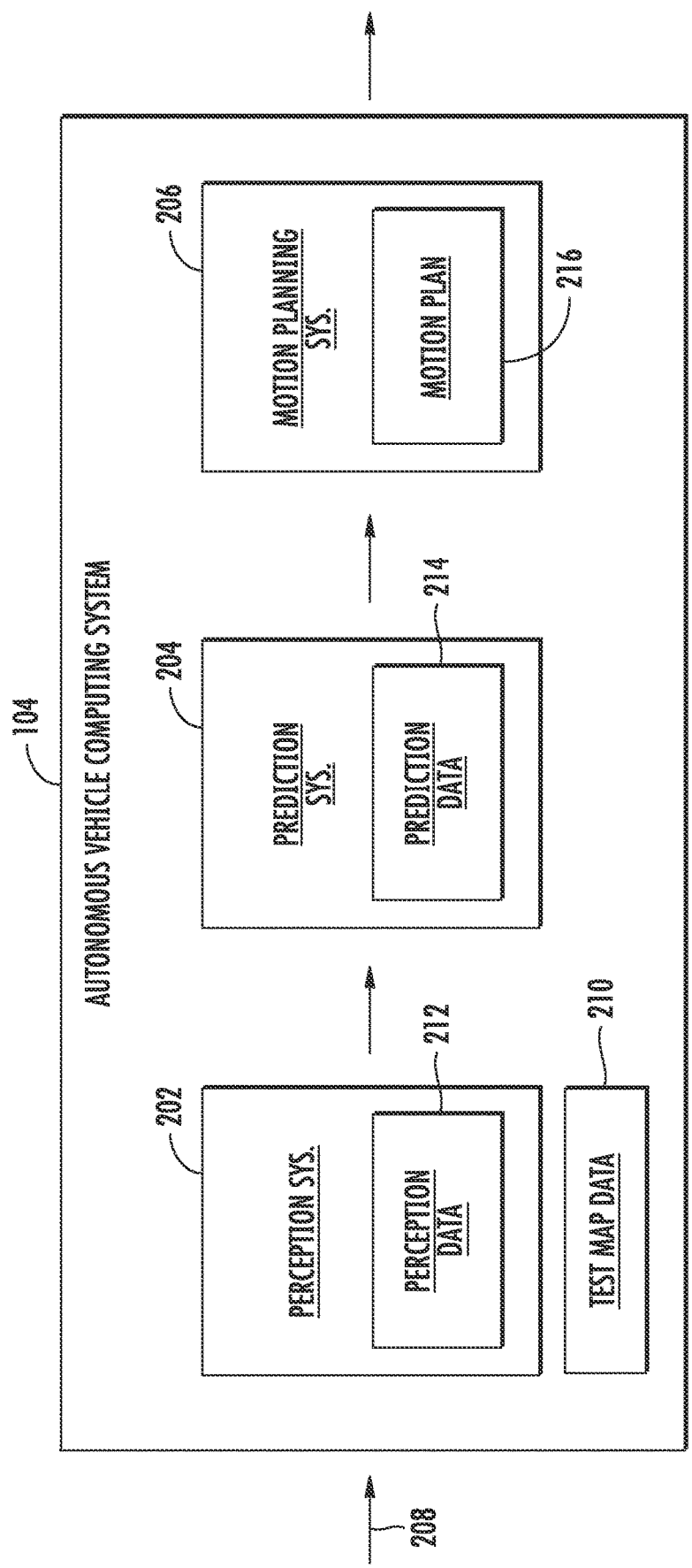
FIG. 2 depicts an example autonomous vehicle computing system according to example embodiments of the present disclosure.

FIG. 2 depicts an overview of the autonomous vehicle computing system 104 according to example embodiments of the present disclosure. The autonomous vehicle computing system 104 can be configured to control an autonomous vehicle within a testing environment. This can include the control of a simulated autonomous vehicle within a simulated testing environment and/or a real autonomous vehicle within a test track environment, as further described herein. The autonomous vehicle computing system 104 can include an autonomy software stack that is the same as or at least similar to the software stack utilized on an autonomous vehicle (e.g., outside of a testing environment). In some implementations, the autonomy software stack utilized in the testing environment can also, or alternatively, include software (e.g., an updated version) that has not been deployed onto an autonomous vehicle.

The autonomous vehicle computing system 104 can include one or more computing devices. The computing device(s) can include various components for performing various operations and functions. For instance, the computing device(s) can include one or more processor(s) and one or more tangible, non-transitory, computer readable media (e.g., memory devices, etc.). The one or more tangible, non-transitory, computer readable media can store instructions that when executed by the one or more processor(s) cause the autonomous vehicle computing system 104 to perform operations and functions, such as those described herein for controlling an autonomous vehicle within a testing environment.

The autonomous vehicle computing system 104 utilized in the testing system 100 can include one or more of the components of an autonomy computing system that would be included in an autonomous vehicle that is acting outside of a testing environment (e.g., deployed in the real-world for a vehicle service) and/or additional components to be tested, if any. For example, the autonomous vehicle computing system 104 can include various sub-systems that cooperate to perceive the testing environment of the autonomous vehicle (e.g., simulated vehicle, real vehicle) and determine a plan for controlling the motion of the autonomous vehicle. The autonomous vehicle computing system 104 can include a perception system 202, a prediction system 204, a motion planning system 206, and/or other systems that cooperate to perceive the testing environment and determine a motion plan for controlling the motion of the autonomous vehicle. For example, the autonomous vehicle computing system 104 can receive input data 208, attempt to comprehend the testing environment by performing various processing techniques on the input data 208 (and/or other data), and generate an appropriate motion plan through such testing environment. The input data 208 can include simulated sensor data, sensor data associated with a simulated testing environment, and/or sensor data associated with a test track testing environment, as further described herein.

In some implementations, in addition to the input data 208, the autonomous vehicle computing system 104 can obtain test map data 210. The test map data 210 can provide detailed information about the testing environment. The test map data 210 can provide information associated with the testing environment such as, for example: the identity and location of different roadways, road segments, buildings, or other items or objects (e.g., lampposts, crosswalks, curbing, etc.); the location and directions of traffic lanes (e.g., the location and direction of a parking lane, a turning lane, a bicycle lane, or other lanes within a particular roadway or other travel way and/or one or more boundary markings associated therewith); traffic control data (e.g., the location and instructions of signage, traffic lights, or other traffic control devices); the location of obstructions (e.g., roadwork, accidents, etc.); and/or any other test map data that provides information that assists the autonomous vehicle computing system 104 in comprehending and perceiving the testing environment.

The autonomous vehicle computing system 104 can identify one or more objects that are proximate to the autonomous vehicle based at least in part on the input data 208 and/or the map data 210. The object(s) can be simulated object(s) (e.g., within a simulated testing environment) and/or real object(s) (e.g., within a test track environment). Additionally, or alternatively, the autonomous vehicle computing system 104 can detect object(s) based on input data 208 that is based at least in part on driving log data (e.g., captured in the logs of autonomous vehicle operation in the real world). This can be used to test new versions of the autonomy software. The autonomous vehicle computing system 104 can include a perception system 202 that can process the input data 208, test map data 210, etc. to generate perception data 212. The vehicle computing system 102 can obtain perception data 212 that is indicative of one or more states (e.g., current and/or past state(s)) of one or more objects that are within a testing environment. For example, the perception data 212 for each object can describe (e.g., for a given time, time period) an estimate of the object's: current and/or past location (also referred to as position); current and/or past speed/velocity; current and/or past acceleration; current and/or past heading; current and/or past orientation; size/footprint (e.g., as represented by a bounding shape); class (e.g., pedestrian class vs. vehicle class vs. bicycle class), the uncertainties associated therewith, and/or other state information. The perception system 202 can provide the perception data 212 to the prediction system 204.

The prediction system 204 can be configured to predict a motion of the object(s) within the testing environment. For instance, the prediction system 204 can create prediction data 214 associated with such object(s). The prediction data 214 can be indicative of one or more predicted future locations of one or more of the object(s). The prediction data 214 can indicate a predicted path associated with each object, if any. The predicted path can be indicative of a predicted object motion trajectory along which the respective object is predicted to travel over time. The prediction data 214 can be indicative of the speed at which the object is predicted to travel along the predicted path and/or a timing associated therewith. The prediction data 214 can be created iteratively at a plurality of time steps such that the predicted movement of the objects can be updated, adjusted, confirmed, etc. over time. The prediction system 204 can provide the prediction data 214 associated with the object(s) to the motion planning system 206.

The motion planning system 206 can determine a motion plan 216 for the vehicle 104 based at least in part on the prediction data 214 (and/or other data). The motion pan 216 can indicate how the autonomous vehicle (e.g., simulated, real) is to move through its testing environment. The motion plan 216 can include vehicle actions with respect to the objects proximate to the vehicle 104 as well as the predicted movements. For instance, the motion planning system 216 can implement an optimization planner that includes an optimization algorithm, which considers cost data associated with a vehicle action as well as other objective functions (e.g., cost functions based on speed limits, traffic lights, etc.), if any, to determine optimized variables that make up the motion plan 216. By way of example, the motion planning system 206 can determine that an autonomous vehicle can perform a certain action (e.g., pass an object) without increasing the potential risk to the vehicle and/or violating any traffic laws (e.g., speed limits, lane boundaries, signage). A motion plan 216 can include a planned motion trajectory of the autonomous vehicle. The planned motion trajectory can be indicative of a trajectory that the autonomous vehicle is to follow for a particular time period. The motion plan 216 can also indicate speed(s), acceleration(s), and/or other operating parameters/actions of the autonomous vehicle.

The motion planning system 206 can be configured to continuously update the vehicle's motion plan 216 and the corresponding planned motion trajectory. For example, in some implementations, the motion planning system 206 can generate new motion plan(s) (e.g., multiple times per second). Each new motion plan can describe motion of the autonomous vehicle over the next several seconds (e.g., 5, 10, 15 seconds, etc.). Moreover, a new motion plan may include a new planned motion trajectory. Thus, in some implementations, the motion planning system 206 can continuously operate to revise or otherwise generate a short-term motion plan based on the currently available data. Once the optimization planner has identified the optimal motion plan (or some other iterative break occurs), the optimal motion plan (and the planned motion trajectory) can be selected and executed to control the motion of the autonomous vehicle.

The autonomous vehicle computing system 104 can provide data indicative of the motion plan 216 to control the real and/or simulated autonomous vehicle within the testing environment. For instance, while in a test track environment, the motion planning system 216 can provide the selected motion plan 216 with data indicative of the vehicle actions, a planned motion trajectory, and/or other operating parameters to the vehicle control system(s) of the real autonomous vehicle to implement the motion plan 216 for the vehicle. For example, the real autonomous vehicle can include a mobility controller configured to translate the motion plan 216 into instructions. By way of example, the mobility controller can translate a determined motion plan 216 into instructions to adjust the steering "X" degrees, apply a certain magnitude of braking force, etc. The mobility controller can send one or more control signals to the responsible vehicle control component (e.g., braking control system, steering control system, acceleration control system) to execute the instructions and implement the motion plan 216. This can allow the vehicle control system(s) to control the motion of the autonomous vehicle in accordance with planned motion trajectory.

In another example, while in the simulated testing environment, the motion planning system 206 can provide the motion plan 216 to the simulation system 102 and the simulation system 102 can use the motion plan 216 to simulate the motion of the simulated autonomous vehicle within the simulated testing environment. In some implementations, the autonomous vehicle computing system 104 (e.g., used in the offline testing) can include a vehicle controller system that simulates the functions of the vehicle controller(s). In such a case, the autonomous vehicle computing system 104 can provide, to the simulation system 102, data indicative of instructions determined by the vehicle controller system based at least in part on the motion plan 216. The simulation system 102 can control the simulated autonomous vehicle based at least in part on the data indicative of the vehicle controller system instructions, as further described herein.

Returning to FIG. 1, the testing system 100 (e.g., the test management system) can configure a test 106 for the autonomous vehicle computing system 104 using a variety of test modalities. In some implementations, a test 106 can be based at least in part on previously collected driving log data that was obtained from one or more autonomous vehicles deployed in the real-world (e.g., outside the testing environment). For such log-based testing, the testing system 100 and/or a user 108 can select driving log data (and/or a section thereof) associated with a scenario that occurred in the real-world. This can include, for example, a scenario in which an operator of the autonomous vehicle (e.g., a human operator) took over control of an autonomous vehicle (e.g., to make a left turn at a certain intersection). The sensor data acquired by the autonomous vehicle in this situation can be provided as input data 208 to the autonomous vehicle computing system 14 in an offline test to examine the autonomy system software (e.g., in order to develop software capable of handling the left turn). For example, in such implementation, the autonomous vehicle computing system 104 can obtain perception data 212 based at least in part on the input data 208. The autonomous vehicle computing system 104 can obtain prediction data 214 and a motion plan 216, accordingly. In some implementations, the motion plan 216 may be utilized to control a simulated autonomous vehicle within a simulated testing environment. The testing system 100 can obtain such data and evaluate the performance of the autonomous vehicle computing system 104 (e.g., any software versions incorporate therein), as further described herein.

In some implementations, a test 106 can be based on a full simulation. For such sim-based testing, the testing system 100 can create a simulated environment in which a simulated autonomous vehicle operates (e.g., as controlled by the autonomous vehicle computing system 104). The testing system 100 can obtain data indicative of one or more initial inputs associated with the simulated environment to help configure the test 106. For example, a user can specify (e.g., via one or more user input devices) various characteristics of the simulated environment that include, for example: a general type of geographic area for the simulated environment (e.g., highway, urban, rural, etc.); a specific geographic area for the simulated environment (e.g., beltway of City A, downtown of City B, countryside of County C, etc.); one or more geographic features (e.g., trees, benches, obstructions, buildings, boundaries, exit ramps, etc.) and their corresponding positions in the simulated environment; a time of day; one or more weather conditions; one or more simulated objects within the simulated environment (e.g., initial position, heading, speed, etc.); a type of each simulated object (e.g., vehicle, bicycle, pedestrian, etc.); a geometry of each simulated object (e.g., shape, size etc.); the motion of the simulated object(s), if any (e.g., an assigned motion trajectory for an actor object, a designation as a static object, etc.); one or more operating conditions of each simulated object (e.g., correct turn signal usage vs. no turn signal usage, functional brake lights vs. one or more brake lights that are non-functional, etc.); one or more initial conditions of the simulated autonomous vehicle within the simulated environment (e.g., initial position, heading, speed, etc.); a type of the simulated autonomous vehicle (e.g., sedan, sport utility, etc.); a geometry of the simulated autonomous vehicle (e.g., shape, size etc.); and/or other data associated with the simulated environment. The testing system 100 can obtain the data indicative of these initial input(s) and generate the simulated environment accordingly. In some implementations, one or more templates can be available for selection, which provide a standardized or otherwise pre-configured simulated environment and the user 108 can select one of the templates and optionally modify the template environment with additional user input.

In a full simulation testing, the autonomous vehicle computing system 104 can be configured to control a simulated autonomous vehicle within the simulated testing environment. For example, simulation system 102 can include various components and subsystems to help run the tests within the simulated testing environment. For instance, the simulation system 102 can include a simulated object dynamics system that is configured to control the dynamics of one or more simulated object(s) within the simulated testing environment. For instance, the simulated object dynamics system 110 can control the motion of the simulated object(s) based at least in part on motion indicated by a series of waypoints defined by a user 108. The simulation system 102 can include a sensor data renderer 112 that is configured to render simulated sensor data associated with the simulated testing environment. This can include, for example, simulated image data, Light Detection and Ranging (LIDAR) data, Radio Detection and Ranging (RADAR) data, and/or other types of data. The simulated sensor data can be indicative of the simulated object(s) within the simulated testing environment. This can include, for instance, simulated sensor data indicative one or more locations of the simulated object(s) within the simulated environment at one or more times.

The simulated sensor data can be provided to the autonomous vehicle computing system 104. The autonomous vehicle computing system 104 can process the simulated sensor data associated with the simulated testing environment (e.g., as input data 208) in a manner that is similar to how an autonomous vehicle would process sensor data associated with a real world environment. For instance, the autonomous vehicle computing system 104 can process the simulated sensor data to detect one or more simulated objects that are within the simulated testing environment. The autonomous vehicle computing system 104 can predict the motion of the simulated object(s) (e.g., as indicated by prediction data 214). The autonomous vehicle computing system 104 can generate a motion plan 216 through the simulated environment, accordingly. The autonomous vehicle computing system 104 can provide data indicative of the motion plan 216 to a simulation system 102 in order to control the simulated autonomous vehicle within the simulated testing environment.

The simulation system 102 can include a simulated vehicle dynamics system 114 configured to control the dynamics of the simulated autonomous vehicle within the simulated testing environment. For instance, the simulated vehicle dynamics system 114 can control the simulated autonomous vehicle based at least in part on the motion plan 216 determined by the autonomous vehicle computing system 104. In some implementations, the simulated vehicle dynamics system 114 can translate the motion plan 216 into instructions and control the simulated autonomous vehicle accordingly (e.g., similar to a mobility controller). In some implementations, the autonomous vehicle computing system 104 can provide data indicative of instructions associated with a motion plan 216 and the simulated vehicle dynamics system 114 can control a simulated autonomous vehicle accordingly (e.g., similar to vehicle control component(s)). In some implementations, the simulated vehicle dynamics system 114 can be programmed to take into account certain dynamics of a vehicle. This can include, for example, processing delays, vehicle structural forces, travel surface friction, and/or other factors to better simulate the implementation of a motion plan on a real autonomous vehicle.

In some implementations, a test 106 can include deploying an autonomous vehicle within a test track environment. For instance, the test track environment can include, for example, a closed course testing environment (e.g., a ground test track, etc.) and/or another testing environment used to test the functions of the autonomous vehicle computing system 104. In such implementations, the autonomous vehicle computing system 104 can be located onboard a real autonomous vehicle (e.g., the onboard autonomy software stack). The testing environment can include travel ways (e.g., roads, intersections, roundabouts, etc.) for the real autonomous vehicle to travel. Testing coordinators can configure the testing environment to test the performance of the autonomous vehicle in accordance with a test plan. In some implementations, the test plan can be configured by the testing system 100 (e.g., based on a testing scenario, an autonomous vehicle capability to be tested, user input, etc.). For example, the test 106 can be configured to examine the autonomous vehicle's ability to predict the motion of certain objects within the vehicle's test track environment, generate vehicle motion plans, implement vehicle motion plans, and/or other autonomous operations. The autonomous vehicle computing system 104 can be configured to provide, to the testing system 100, feedback data indicative of the operations of the autonomous vehicle computing system 104 that are performed to navigate the test track environment.

Figure 3:
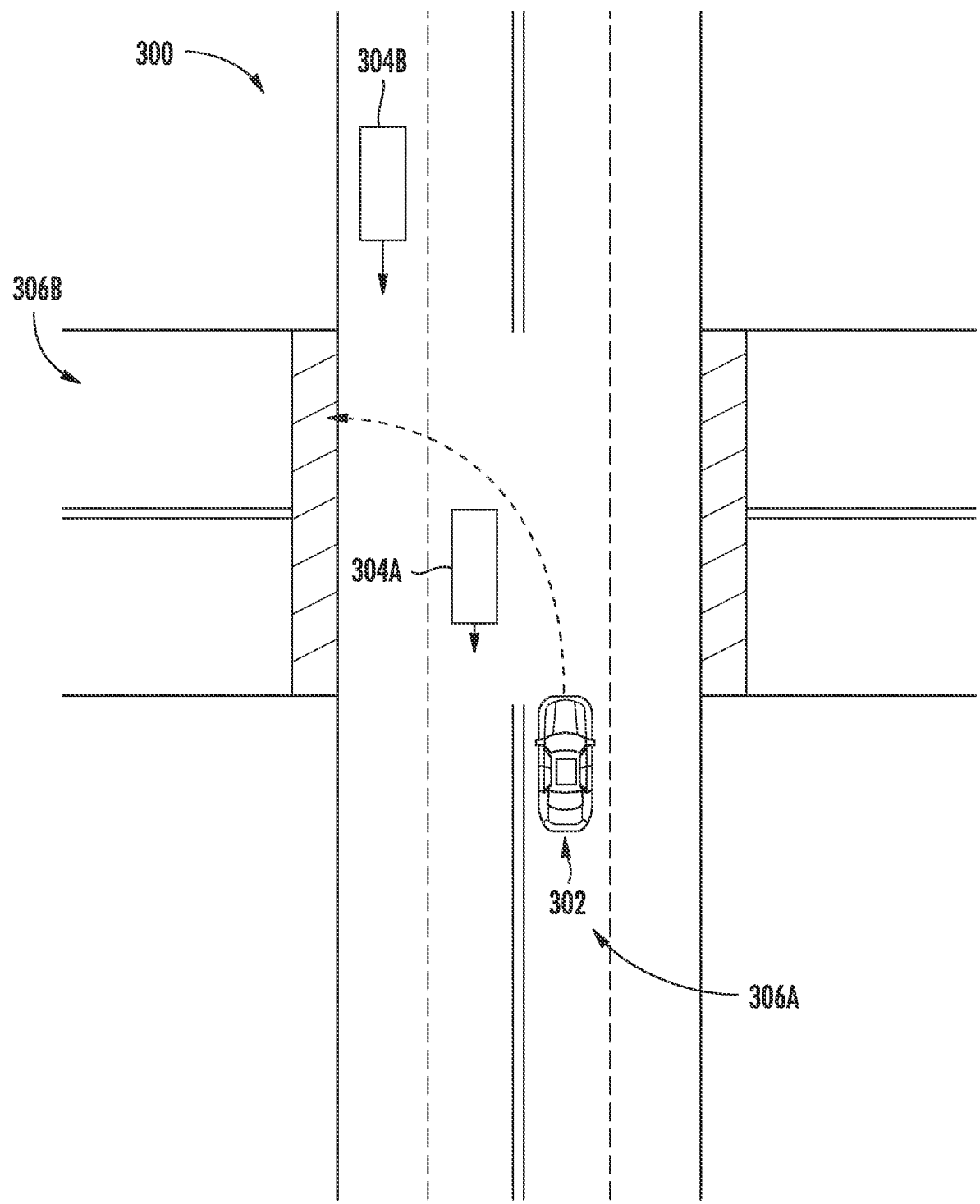
FIG. 3 depicts an example testing environment according to example embodiments of the present disclosure.

FIG. 3 depicts an example testing environment 300 according to example embodiments of the present disclosure. An autonomous vehicle 302 can be included within the testing environment 300. In some implementations, the testing environment 300 can be a simulated testing environment and the autonomous vehicle 302 can be a simulated autonomous vehicle. In some implementations, the testing environment 300 can be a test track environment and the autonomous vehicle can be a real autonomous vehicle. One or more objects 304A-B can be included within the testing environment 300. For example, the testing environment 300 can include a first object 304A and/or second object 304B. The object(s) 304-B can include, for example, simulated and/or real vehicles, bicycles, pedestrians, etc. One or more of the object(s) 304A-B (e.g., static objects) can be configured to remain stationary within the testing environment 300. Additionally, or alternatively, one or more of the object(s) 304A-B (e.g., actor objects) can be configured to move within the testing environment 300 in various directions and/or at various times.

The testing environment 300 can include a geographic area. In some implementations, the geographic area can be a simulated version of a real geographic area (e.g., located within a real city). For example, as shown in FIG. 3, the testing environment 30) can include a geographic area such as, for example, an intersection. This can be a simulated version of an intersection found in the real-world in which a human operator had to assume control of an autonomous vehicle to navigate. The intersection can allow for the autonomous vehicle 302 to make a left turn (e.g., an unprotected left turn) from a first travel way 306A to a second travel way 306B.

Returning to FIG. 1, the testing system 100 can determine one or more autonomous vehicle capabilities 116 that are tested by the test 106. For example, the testing system 100 can include a test management system 118. The test management system 118 and other systems (e.g., the simulation system 102 and its sub-systems, etc.) of the testing system can be implemented via the one or more computing devices of the testing system 100. The test management system 118 can be configured to manage the data associated with the testing system 100, initiate tests 106, and/or other operations and functions described herein.

The testing system 100 (e.g., the test management system 118) can be configured to determine the one or more autonomous vehicle capabilities 116 that are tested by the test 106. An autonomous vehicle capability 116 can be a feature, function, and/or behavior of an autonomous vehicle. This can include a capability that the autonomous vehicle is expected to be able to perform and/or a capability that is being developed. The autonomous vehicle capabilities can include, for example: speed limits and directions (e.g., conformity to specified speed limits, directions of travel, lane restrictions, etc.); stop and go traffic (e.g., ability to properly handle dense traffic conditions with frequent slowdowns, starts, stops, etc.); turning (e.g., ability to handle left hand turns, unprotected turns, three point turns, U-turns, etc.); parallel parking; navigating certain geographic features (e.g., crossing train tracks); traveling in reverse (e.g., backing into a parking space); signaling (e.g., handling turn signal(s) from other objects); juking; handling jaywalkers; and/or other capabilities of an autonomous vehicle. By way of example, the autonomous vehicle capabilities of testing environment 300 can include the performance of a left turn (e.g., an unprotected left turn). The one or more autonomous vehicle capabilities 116 can be included in a group (e.g., list, table, other data structure, etc.) of pre-defined of autonomous vehicle capabilities and/or created as a new capability.

In some implementations, an autonomous vehicle capability 116 can depend on another autonomous vehicle capability. For example, the autonomous vehicle's ability to handle stop-and-go traffic can depend on its ability to handle speed limits and direction. If tests associated with speed limits and directions fail, then failures to tests associated with stop-and-go traffic may be less meaningful.

Additionally or alternatively, the testing system 100 can automatically determine which autonomous vehicle capabilities 116 are tested by the test. By way of example, the testing system 100 can obtain data indicative of the test 106 of an autonomous vehicle computing system 104 (e.g., driving logs, data indicative of a simulated environment, a test plan for test-track testing, etc.). The testing system 100 can mine the data indicative of the test 106 to determine one or more autonomous vehicle capabilities 116 that are being tested by the test 106. This can include, for example, processing one or more parameters of the testing environment to determine one or more autonomous vehicle capabilities 116 that are being tested by the test 106. For example, the testing system 100 can determine that a test 106 that includes the testing environment 300 may be testing the ability of the autonomous vehicle 302 to make a left turn (e.g., an unprotected left turn). In another example, in the event that the testing environment includes a traffic-dense highway with objects (e.g., simulated vehicles) at various slow speeds and stopped positions, the testing system 100 can determine that the test 106 is evaluating the autonomous vehicle's ability to handle stop-and-go traffic (and/or any other interdependent capabilities).

Figure 4:
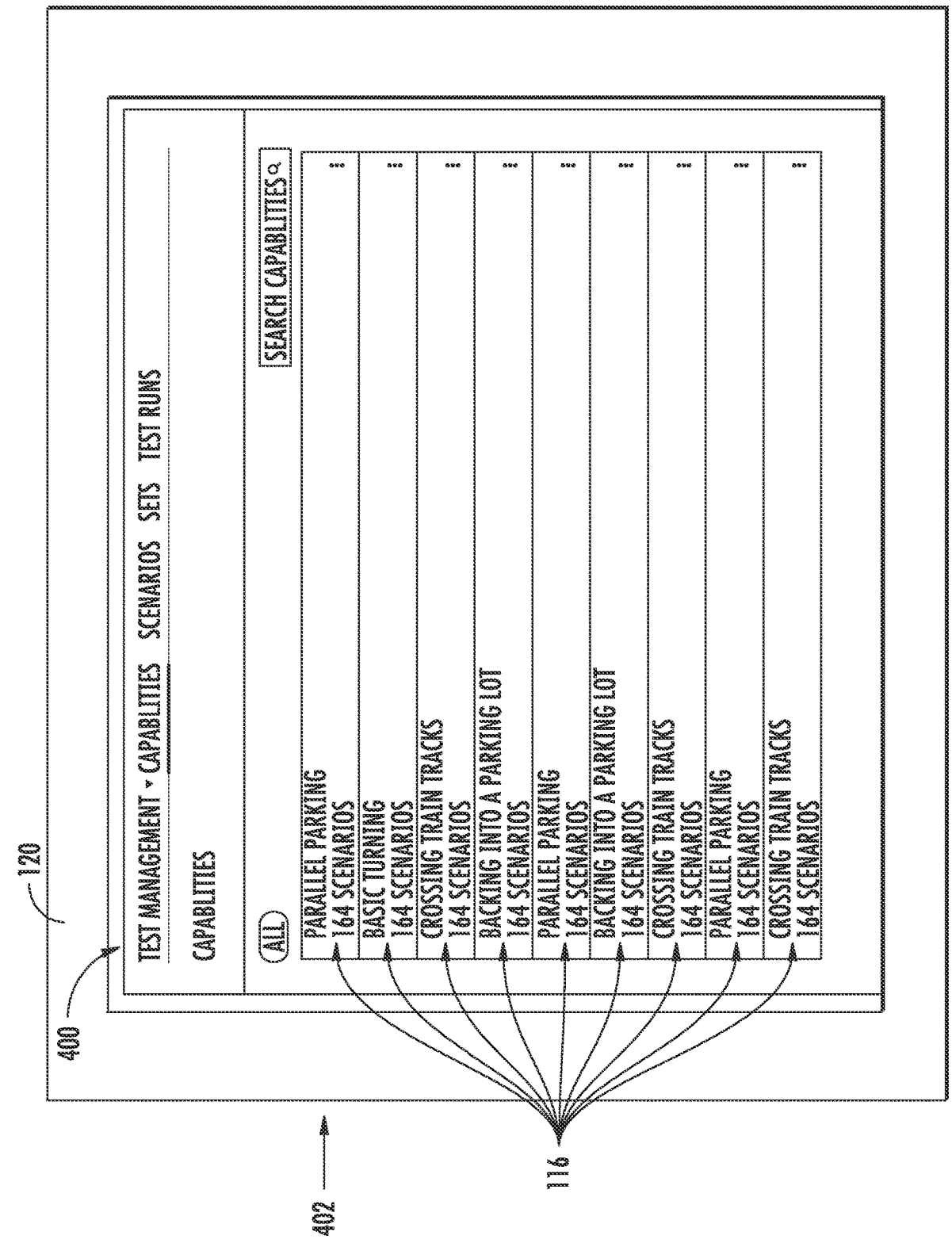
FIG. 4 depicts an example user interface according to example embodiments of the present disclosure.

In some implementations, the testing system 100 (e.g., the test management system 118) can determine which autonomous vehicle capabilities 116 are tested by the test 106 based at least in part on user input. For example, FIG. 4 depicts an example user interface 400 according to example embodiments of the present disclosure. The testing system 100 can provide for display the user interface 400 (e.g., data indicative thereof) via one or more display devices 120 (e.g., display screens, touchscreens, projection-based device, LCD-based device, LED-based device, etc.). A user 108 (e.g., a test operator) can view the user interface 400 via the one or more display devices 120. The user interface 400 can present a visual representation of the one or more autonomous vehicle capabilities 116 for selection by the user 108 (e.g., via a checkbox, drop down menu, etc.) via a user input device 122 (e.g., shown in FIG. 1). The user input device 122 can include, for example, a device to control a cursor (e.g., mouse, gyroscope, etc.), a keyboard, a touchscreen, and/or other user input devices. In some implementations, the user interface 400 can include an interactive element (e.g., text entry box, etc.) via which the user 108 can define a new autonomous vehicle capability 116. The testing system 100 can obtain data indicative of user input 402 that identifies the one or more autonomous vehicle capabilities 116 (e.g., selecting the autonomous vehicle capabilities 116). The testing system 100 can determine that the one or more autonomous vehicle capabilities 116 are tested by the test 106 based at least in part on the data indicative of the user input 402 (e.g., because such capabilities are selected by the user 108).

Returning to FIG. 1, the testing system 100 (e.g., the test management system 118) can determine a testing scenario 124 that corresponds to the test 106. A testing scenario 124 can be a situation used to test the one or more autonomous vehicle capabilities 116. The testing scenario 124 can indicate one or more testing parameters of a test 106 such as, for example: the type of geographic area represented in the testing environment (e.g., intersection, highway, cul-de-sac, dead end, etc.), features of the geographic area (e.g., train tracks, obstructions, etc.); one or more objects within the testing environment (e.g., vehicles, bicycles, pedestrians, etc.); weather condition(s), and/or other parameters. An individual test 106 can be a variation of the testing scenario 124 that evaluates the one or more autonomous vehicle capabilities 116. By way of example, the testing scenario 124 of a test 106 that includes the testing environment 300 can be: a left turn at a four way intersection with two objects (e.g., objects 302A-B). The individual test 106 can include the autonomous vehicle 302 performing a left turn, at the four-way intersection, with two moving objects, where the first object 302A is moving at a first speed (e.g., thirty-five mph, etc.) initiated at a first time and the second object 302B is moving a second speed (e.g., forty-five mph, etc.) initiated at a second time. In some implementations, the testing scenario 124 can be included in a plurality of testing scenarios (e.g., a set of testing scenarios) that is grouped by the testing parameters. A testing scenario 124 can be a pre-existing testing scenario and/or created as a new testing scenario.

The testing scenario 124 can be generated at least in part using real-world data 126. For instance, a testing scenario 124 can be based on a scenario that occurred in the real-world (e.g., while an autonomous vehicle was deployed outside of a testing environment). This can include, for example, a scenario in which a human operator of the autonomous vehicle assumed control of the autonomous vehicle. Additionally, or alternatively, this can include a scenario in which the operating mode of the autonomous vehicle was adjusted from a fully autonomous operating mode to another operating mode (e.g., semi-autonomous operating mode, manual operating mode, etc.) to allow a human operator to, at least partially, control the autonomous vehicle. By way of example, an autonomous vehicle within the real-world may have a human operator at least partially assume control of the autonomous vehicle to perform a certain unprotected left-turn at an intersection where there are several moving objects within the surrounding environment of the autonomous vehicle.

The autonomous vehicle can generate and/or otherwise obtain real-world data 126 associated with such a real-world scenario. For example, the autonomous vehicle can generate driving log data that is indicative of the parameters of the vehicle (e.g., location, speed, etc.) as well as the parameters of the surrounding environment (e.g., geographic area, objects, etc.). Additionally, or alternatively, the autonomous vehicle can acquire sensor data via one or more sensors (e.g., onboard the autonomous vehicle) associated with the surrounding environment of the real-world before, during, and/or after the real-world scenario occurs. The sensor data can include, for example, image data (e.g., still image data, video image data, etc.), Light Detection and Ranging (LIDAR) data, Radio Detection and Ranging (RADAR) data, and/or other types of data. The real-world data 126 can include at least one of the driving log data (e.g., generated by one or more autonomous vehicles), the sensor data (e.g., obtained by one or more autonomous vehicles), and/or other types of data associated with the real-world scenario (e.g., satellite imagery, map data, traffic data, weather data, etc.).

The testing system 100 can generate a testing scenario 124 based at least in part on the real-world data 124. In some implementations, the testing system 100 can obtain the real-world data 126 (e.g., from a vehicle computing system, from another system that obtains and stores such data, etc.). The testing system 100 can identify one or more testing parameters based at least in part on the real-world data 126. For example, the testing system 100 can mine the real-world data to determine the type of geographic area represented in the real-world scenario, features of the geographic area, one or more objects within the surrounding environment, weather condition(s), and/or other parameters. The testing system 100 can identify testing parameters based at least in part on these parameters of the real-world scenario, such that the testing parameter(s) are the same as or at least similar thereto. The testing system 100 can generate the testing scenario 124 based at least in part on the identified testing parameters. In some implementations, a user 108 can review the real-world data 126 (e.g., via a user interface) and select the testing parameters of a testing scenario 124 (e.g., via user input to the user interface) to define the testing scenario 124. The testing system 100 can generate the testing scenario 124 based at least in part on such user input.

In some implementations, the testing system 100 can automatically determine which testing scenario 124 corresponds to a test 106. By way of example, the testing system 100 can obtain data indicative of the test 106 (e.g., driving logs, simulated sensor data, data indicative of a testing environment, data indicative of associated test parameters, etc.). The testing system 100 can mine the data indicative of the test 106 to determine the test's various testing parameters. By way of example, for a test 106 that includes the testing environment 300, the testing system 100 can determine that the testing environment 30) includes an autonomous vehicle 302 making a left turn at a four-way intersection with two objects 304A-B. Accordingly, the testing system 100 can determine that a testing scenario 124 including a "four-way intersection with two objects" best corresponds to the test 106.

Figure 5:
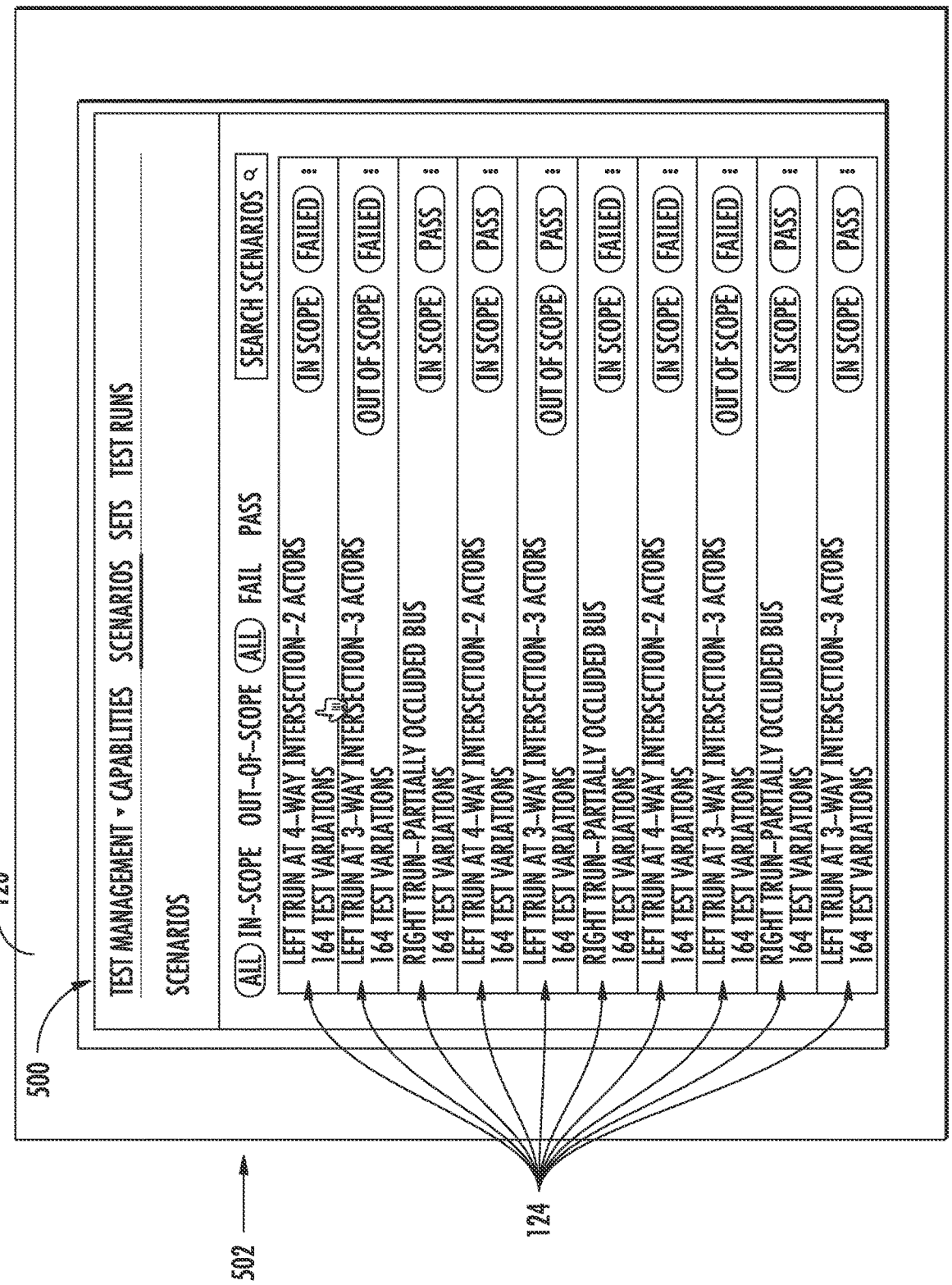
FIG. 5 depicts another example user interface according to example embodiments of the present disclosure.

Additionally, or alternatively, the testing system 100 can determine a testing scenario 124 that corresponds to a test 106 based at least in part on user input. For example, FIG. 5 depicts another example user interface 500 according to example embodiments of the present disclosure. The testing system 100 can provide the user interface 500 via one or more display devices 120. In some implementations, a testing scenario 124 can be a pre-existing testing scenario. A user 108 can view a plurality of testing scenarios 124 (e.g., pre-existing testing scenarios) via the user interface 500 on the display device(s) 120. For example, the user 108 can identify (e.g., select, mark, etc.) a testing scenario 124 via user input 502 (e.g., to the user input device 122). The testing system 100 can obtain data indicative of the user input 502 that identifies a testing scenario 124 (e.g., a pre-existing testing scenario) as corresponding to the test 106. The testing system 100 can determine that the testing scenario 124 (e.g., the pre-existing testing scenario) corresponds to the test 106 based at least in part on the data associated with the user input 502. For example, the user 108 can select a testing scenario 124 that includes a four way intersection with two objects as corresponding to the test 106 that includes the testing environment 300. Accordingly, the testing system 100 can determine that this testing scenario 124 corresponds to the test 106 (e.g., because the user 108 selected it).

Additionally or alternatively, the user interface 500 can present an interactive element (e.g., text entry box, etc.) via which the user 108 can define a new testing scenario. For example, the user 108 can provide user input 502 (e.g., via the user interface 500) indicating one or more testing parameters. As described herein, the testing parameters can be indicative of, for example, at least one of a geographic area (e.g., a four way intersection) or one or more objects (e.g., two objects) within the testing environment. The testing system 100 can generate a new testing scenario based at least in part on data indicative of the user input 502 specifying the one or more testing parameters.

Returning to FIG. 1, the testing system 100 can associate data indicative of the test 106 with data indicative of the one or more autonomous vehicle capabilities 116 that are tested by the test 106 and data indicative of the testing scenario 124. For instance, the testing system 100 can create an associated data structure (e.g., linked data structure, etc.) based at least in part on the data indicative of the test 106, the data indicative of the one or more autonomous vehicle capabilities 116, and/or the data indicative of the testing scenario 124. The associated data structure can include these types of data/data sets linked together and/or organized by references (e.g., links, pointers, tags, etc.). The testing system 100 can store, in an accessible memory 128, the data indicative of the test 106 associated with the data indicative of the testing scenario 124 and the data indicative of the one or more autonomous vehicle capabilities 116 that are tested by the test 106 (e.g., the associated data structure).

In some implementations, the testing system 100 can create the associated data structure in response to user input selecting a testing scenario 124 and one or more autonomous vehicle capabilities 116 as being associated with the test 106. For example, the testing system 100 can obtain data indicative of one or more user inputs 402, 502 provided via a user interface 400, 500. The one or more user inputs 402, 502 can be indicative of an association between the data indicative of the test 106 with the data indicative of the testing scenario 124 and the data indicative of the one or more autonomous vehicle capabilities 116. The testing system 100 can associate (e.g., link, etc.) the data indicative of the test 106 with the data indicative of the testing scenario 124 and the data indicative of the one or more autonomous vehicle capabilities 116 based at least in part on the data indicative of the one or more user inputs 402, 502.

In some implementations, the testing system 100 can create the associated data structure without obtaining data indicative of user input. For example, as described above, the testing system 100 can mine data indicative of the test 106 and the associated testing environment 300 to determine one or more autonomous vehicle capabilities 116 that are tested by the test 106 and at least one testing scenario 124 that corresponds to the test 106. The testing system 100 can associate data indicative of the test 106, with data indicative of the one or more autonomous vehicle capabilities 116, and data indicative of the at least one testing scenario 124 based on such determinations.

The testing system 100 can associate the test 106 with the one or more autonomous vehicle capabilities 116 and the testing scenario 124 so that a query for one or more of these elements (e.g., test, capabilities, testing scenario, etc.) will return the associated data structure indicative of all three. By way of example, a test 106 can include an autonomous vehicle 302 (e.g., simulated autonomous vehicle, real autonomous vehicle on a test track) within a testing environment 300 making a left turn, at the four-way intersection, with two moving objects 304A-B. The testing system 100 can associate this test 106 with the autonomous vehicle capability 116 of "performing a left turn" and a testing scenario 124 of "four-way intersection, with two moving objects," such that data indicative of the test 106 is linked and/or otherwise associated with data indicative of the autonomous vehicle capability 116 and data indicative of the testing scenario 124. In the event that a user 108 later searches for tests that evaluate the ability of the autonomous vehicle to perform a left turn, the testing system 100 (e.g., the test management system 118) can return at least this test as being associated with such an autonomous vehicle capability 116. For example, the testing system 100 can obtain a query indicative of at least one of the test 106, the testing scenario 124, or the one or more autonomous vehicle capabilities 116. The testing system 100 can search for and identify (e.g., via the memory 128) the associated data structure that is indicative of the test 106, the vehicle capabilities 116, and/or the testing scenario 124.

In some implementations, the testing system 100 can associate a test 106 with one or more labels. By way of example, the testing system 100 can label (e.g., based on user input) a test 106 (and/or testing scenario 124) as sound or unsound. A sound test/testing scenario can designate a test variation/testing scenario that is executable and that produces meaningful results when executed (e.g., produces valid results). An unsound test can designate a test variation/testing scenario that is not executable and/or that does not produce meaningful results when executed (e.g. produces invalid results). The testing system 100 can obtain data indicating that the test 106 (and/or testing scenario 124) is sound or unsound. This can include, for example, test result data (e.g., from an autonomous vehicle computing system 104) that is not statistically meaningful. The testing system 100 can designate, in the accessible memory 128, the test 106 (and/or testing scenario 124) as sound or unsound based at least in part on the data indicating that the test is sound or unsound.

Additionally or alternatively, the testing system 100 can label (e.g., based on user input) a test 106 (and/or testing scenario 124) as in-scope or out-of-scope. An in-scope test/testing scenario can designate a test/testing scenario that the autonomous vehicle computing system 104 (e.g., the tested software) is expected to pass. An out-of-scope test/testing scenario can designate a test/testing scenario that the autonomous vehicle computing system 104 (e.g., the tested software) is not expected to pass. The testing system 100 can obtain data indicating that the test 106 (and/or testing scenario 124) is in-scope or out-of-scope. This can include, for example, user input identifying the test 106 (and/or testing scenario 124) as in-scope or out-of-scope. The testing system 100 can designate, in the accessible memory 128, the test 106 as in-scope or out-of-scope based at least in part on the data indicating that the test 106 (and/or testing scenario 124) is in-scope or out-of-scope. In some implementations, the scope and soundness of a test/testing scenario can help determine whether a test 106 (and/or testing scenario 124) should be promoted (e.g., included in a golden set of tests/testing scenarios that a software version is required to pass) or demoted (e.g., removed from a golden set of tests/testing scenarios that a software version is required to pass).

The testing system 100 can also associate test result data 132 with a test 106 as well as its associated testing scenario 124 and autonomous vehicle capabilities 116. For instance, an autonomous vehicle computing system 104 can be configured to control a simulated autonomous vehicle within a simulated test environment and/or a real autonomous vehicle within a test track environment. As described herein, the autonomous vehicle computing system 104 can include a software stack that is the same as or at least similar to the software stack utilized outside of a testing environment. Additionally, or alternatively, the software stack utilized in the testing environment can include software (e.g., a new, updated version, etc.) that has not been deployed onto an autonomous vehicle. The autonomous vehicle computing system 104 can perceive the testing environment, predict the motion of object(s) within the testing environment, and control the motion of the simulated or real autonomous vehicle, as described herein. The testing system 100 can obtain test result data 132 associated with a test (e.g., based at least in part on these operations of the autonomous vehicle computing system 104). For example, the testing system 100 can obtain feedback data 134 from the autonomous vehicle computing system 104 generated before, during, and/or after a test 106 is run. The feedback data 134 can include the perception data 212, the prediction data 214, the motion data 216, driving log data generated by the autonomous vehicle computing system 104 and/or other data. The test result data 132 can be based at least in part on the feedback data 134 from the autonomous vehicle computing system 104. For instance, the testing system 101 can evaluate the feedback data to determine test result data 132 that is indicative of whether the autonomous vehicle computing system 104 (e.g., the tested software) properly perceived its testing environment, predicted object motion, appropriately planned vehicle motion, and/or satisfactorily performed the tested capabilities. Additionally, or alternatively, the test result data 132 can be indicative of whether the autonomous vehicle computing system 104 passed or failed the test 106.

In some implementations, the testing system 100 can be configured to determine a performance metric associated with the autonomous vehicle computing system 104. For instance, the testing system 100 can obtain the test result data 132. The testing system can determine a performance metric based at least in part on the test result data 132. For example, the performance metric can be indicative of the performance of the autonomous vehicle computing system 104 (e.g., the software version being tested) for a test 106 and/or a testing scenario 124. The performance metric can indicate whether the autonomous vehicle computing system 104 passed, failed, did not complete, etc. the test 106 and/or testing scenario 124. In some implementations, the performance metric can include a score that is indicative of the performance of the autonomous vehicle computing system 104 with respect to the test 106 and/or testing scenario 124 (e.g., a scale score indicating how well the system performed). The performance metric can be determined for a plurality of tests associated with a testing scenario 124 and/or an autonomous vehicle capability 116. In some implementations, the performance metric may be indicative of an aggregate performance of the autonomous vehicle computing system 104 over a plurality of tests and/or testing scenarios. The test result data 132 can be indicative of the performance metric. The testing system 100 can also associate the test result data 132 with data indicative of the test 106, data indicative of the testing scenario 124, and/or one or more autonomous vehicle capabilities 116, in a manner similar to that described herein.

Figure 6:
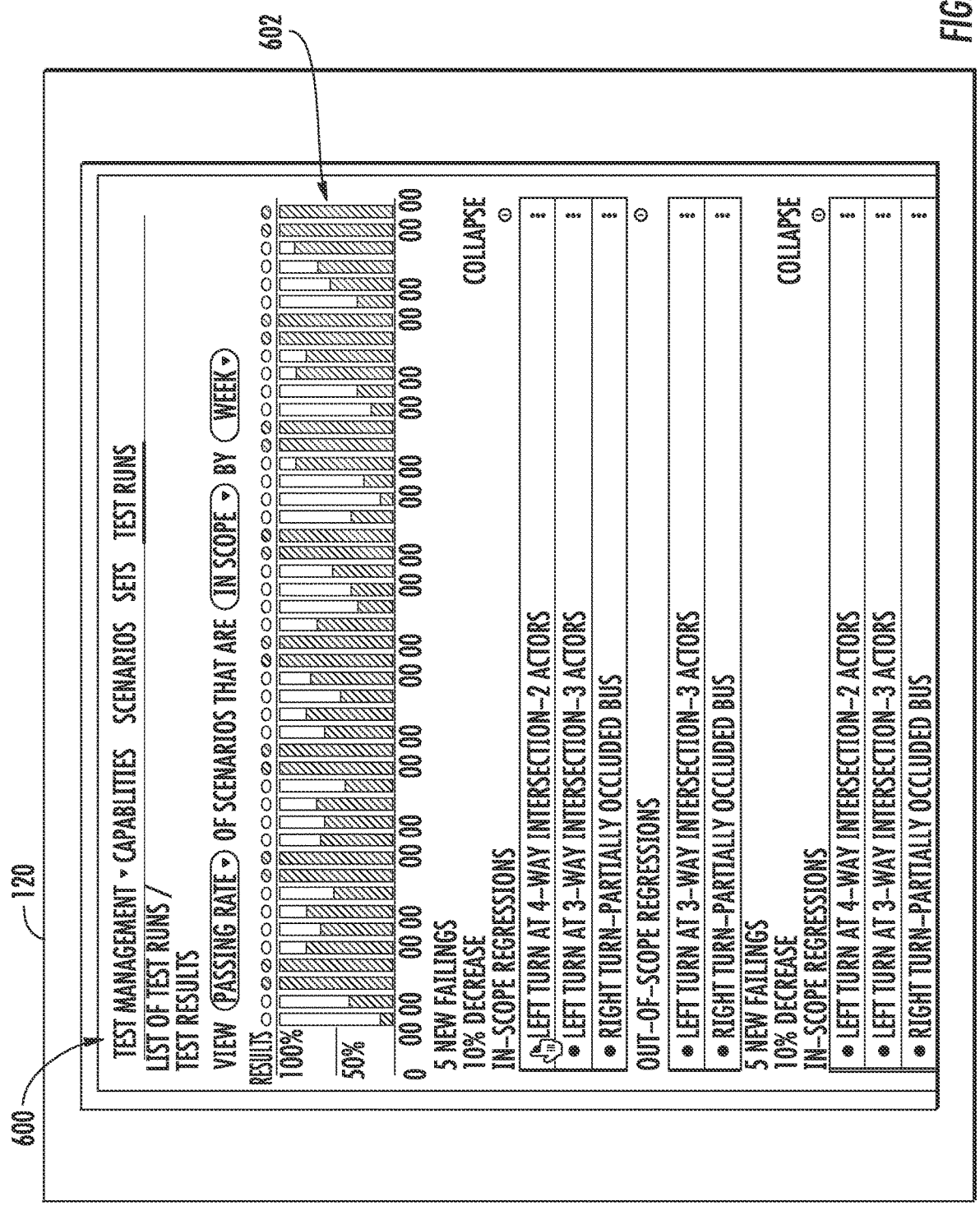
FIG. 6 depicts another example user interface according to example embodiments of the present disclosure.

In some implementations, the testing system 100 can provide for display the test result data 132 via a user interface of a display device 120. For example, FIG. 6 depicts an example user interface 600 according to example embodiments of the present disclosure. The testing system 100 can provide the user interface 600 via one or more display devices 120. A user 108 (e.g., a test operator) can view the user interface 600 via the one or more display devices 120. The user interface 600 can present a visual representation of the test result data 132. For example, the user interface 600 can present a visual representation of a performance metric 602 associated with one or more tests and/or testing scenarios. Moreover, the user interface 600 can present the testing progress associated with a testing scenario (e.g., percentage decrease in the number of tests failed, percentage increase in the number of tests passed, etc.). The test result data 132 can be filtered and/or searched via the user interface 600. Moreover, the user interface 600 can indicate one or more label(s) for a test 106 and/or testing scenario 124 (e.g., whether a test/testing scenario is sound or unsound, whether a test/testing scenario is in-scope or out-of-scope).

Returning to FIG. 1, as described herein, the testing system 100 can store the associated data in an accessible memory 128. The memory 128 can include, for example, a searchable database. For instance, the testing system 100 can store (e.g., in the memory 128) data indicative of the test 106 associated with data indicative of the testing scenario 124, data indicative of the one or more autonomous vehicle capabilities 116 that are tested by the test 106, and/or the associated test result data 132. This can allow the testing system 100 to quickly retrieve the associated data structure from the memory 128. For example, a user 108 can provide (e.g., via user input to a user interface) a search query indicative of at least one of the test 106, the testing scenario 124, or the one or more autonomous vehicle capabilities 116. In response, the testing system 100 can access the memory 128 and present a user interface indicating the test 106, the associated testing scenario 124, the tested autonomous vehicle capabilities 116, and/or at least a portion of the associated test result data 32. Moreover, the testing system 100 can enable a user 108 to modify (e.g., the testing environment) and/or re-run the test 106 (e.g., to test a newer software version) by providing user input to the user interface. The testing system 100 can execute/re-execute a test 106 based at least in part on the user input. In some implementations, the testing system 100 can automatically execute a test 106 based on a schedule, the performance of the autonomous vehicle computing system 104, and/or other factors. For example, the testing system 100 can determine whether certain test(s) 106 and/or testing scenario(s) 124 have not been run, are lacking test result data, and/or lack sufficient performance. The testing system 100 can initiate one or more tests based on such determinations.

Figure 7:
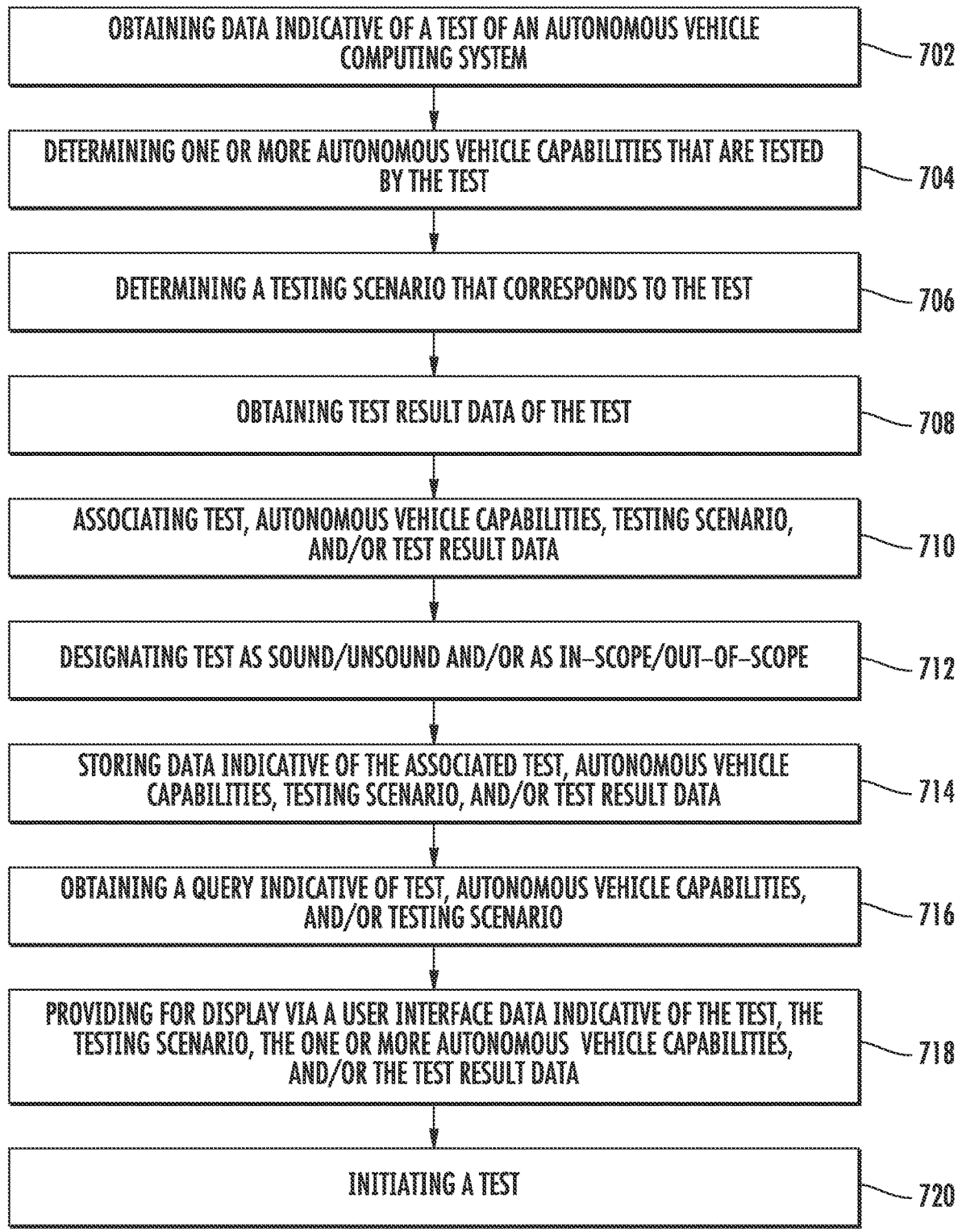
FIG. 7 depicts a flow diagram of an example method for autonomous vehicle testing according to example embodiments of the present disclosure.

FIG. 7 depicts a flow diagram of another example method 700 for autonomous vehicle testing according to example embodiments of the present disclosure. One or more portion(s) of the method 700 can be implemented by one or more computing devices such as, for example, the one or more computing device(s) of the testing computing system 100 and/or other systems. Each respective portion of the method 700 can be performed by any (or any combination) of the one or more computing devices. Moreover, one or more portion(s) of the method 700 can be implemented as an algorithm on the hardware components of the device(s) described herein (e.g., as in FIGS. 1 and 8). FIG. 7 depicts elements performed in a particular order for purposes of illustration and discussion and is not meant to be limiting.

At (702), the method 700 can include obtaining data indicative of a test of an autonomous vehicle computing system. For instance, the testing system 100 can obtain data indicative of a test 106 of an autonomous vehicle computing system 104. Such data can include data indicative of test parameters of the test 106, data indicative of the testing environment 300, data utilized in formulating the test 106 (e.g., driving log data, sensor data, etc.) and/or other data.

At (704), the method 700 can include determining one or more autonomous vehicle capabilities that are tested by the test. For instance, the testing system 100 can determine one or more autonomous vehicle capabilities 116 that are tested by the test 106. In some implementations, the testing system 100 can process the data indicative of the test 106 to determine the autonomous vehicle capabilities 116. In some implementations, the testing system 100 can obtain data indicative of user input 402 that identifies the one or more autonomous vehicle capabilities 116. The testing system 100 can determine that the one or more autonomous vehicle capabilities 116 are tested by the test 106 based at least in part on the data indicative of the user input 402. The one or more autonomous vehicle capabilities 116 can be included in a group of pre-defined autonomous vehicle capabilities and/or can be defined as new autonomous vehicle capabilities being tested.

At (706), the method 700 can include determining testing scenario that corresponds to the test. The testing computing system 100 can determine a testing scenario 124 that corresponds to the test 106. The testing scenario 124 can be generated at least in part using real-world data 126. The real-world data 126 can include driving log data associated with one or more autonomous vehicles. Additionally, or alternatively, the real-world data 126 can include sensor data obtained via one or more sensors of one or more autonomous vehicles. The sensor data can include at least one of image data, Light Detection and Ranging data, or Radio Detection and Ranging data. The image data can include, for example, video data obtained via the sensor(s) of one or more autonomous vehicles.

In some implementations, the testing system 100 can automatically generate the testing scenario 124. For instance, the testing system 100 can identify one or more testing parameters based at least in part on the real-world data 126. The testing parameters can, for example, be indicative of at least one of a geographic area or one or more objects. The testing system 100 can generate the testing scenario 124 based at least in part on the one or more testing parameters. In some implementations, the testing system 124 can automatically determine that the testing scenario 124 corresponds to the test 106, as described herein. In some implementations, the testing system 100 can obtain data indicative of user input 502 that identifies the testing scenario 124 as corresponding to the test 106. The testing system 100 can determine that the testing scenario 124 corresponds to the test 106 based at least in part on the data associated with the user input 502.

In some implementations, the testing scenario 124 can be a pre-existing testing scenario. The testing system 100 can automatically determine that the pre-existing testing scenario corresponds to the test 106. Additionally, or alternatively, the testing system 100 can obtain data indicative of user input that identifies the pre-existing testing scenario as corresponding to the test 106. The testing system 100 can determine that the pre-existing testing scenario corresponds to the test based at least in part on the data indicative of such user input.

In some implementations, when the testing system 100 automatically determines the one or more autonomous vehicle capabilities 116 tested by the test 106 and/or the testing scenario 124, the user 108 can be given the opportunity to confirm the determination (e.g., via a user input associated with a user interface).

At (708), the method 700 can include obtaining test result data of the test. For instance, the testing system 100 can obtain test result data 132 of the test 106. The test result data 132 can be based at least in part on feedback data 134 from the autonomous vehicle computing system 104. As described herein, the feedback data 134 can include data obtained and/or generated by the autonomous vehicle computing system 104 during a test 106.

At (710), the method 700 can include associating the test, autonomous vehicle capabilities testing scenario, and/or the test result data. For instance, the testing system 100 can associate the data indicative of the test 106 with data indicative of the one or more autonomous vehicle capabilities 116 that are tested by the test 106 and data indicative of the testing scenario 124. Additionally, or alternatively, the testing system 100 can associate the test result data 132 with the data indicative of the test 106. As described herein, to do so, the testing system 100 can generate an associated data structure that links (and/or otherwise references together) the test 106, the testing scenario 124, the autonomous vehicle capabilities 116 being tested, and/or the test result data 132. In some implementations, at (712), the testing system 100 can label a test 106 and/or testing scenario 124 as sound or unsound, as described herein. Additionally, or alternatively, the testing system 100 can label the test 106 and/or testing scenario 124 as in-scope or out-of-scope. Such labels can be associated with the other data in the associated data structure.

At (714), the method 700 can include storing data indicative of the associated test, the autonomous vehicle capabilities, the testing scenario, and/or the test result data. For instance, the testing system 100 can store, in an accessible memory 128, the data indicative of the test 106 associated with the data indicative of the testing scenario 124 and the data indicative of the one or more autonomous vehicle capabilities 116 that are tested by the test 106. Moreover, the testing system 100 can store (e.g., in the accessible memory 128) the data indicative of the test 106 associated with the test result data 132. In some implementations, the testing system 100 can store the data indicative of the labels 130 (e.g., sound/unsound, in-scope/out-of-scope, etc.) with data indicative of the test 106 (and/or other associated data).

At (716), the method 700 includes obtaining a query indicative of the test, the autonomous vehicle capabilities, and/or the testing scenario. For instance, the testing system 100 can obtain a query indicative of at least one of the test 106, the testing scenario 124, or at least one of the one or more autonomous vehicle capabilities 116. In some implementations, the query can be indicative of the test result data 132 and/or one or more labels 130. In response, the testing system 100 can search the accessible memory 128 based at least in part on the query. The testing system 100 can providing for display via one or more display devices 120, a user interface indicative of at least one of the test 106, the testing scenario 124, the one or more autonomous vehicle capabilities 116, the test result data, or the one or more labels 130, at (718). A user 108 can select (e.g., via user input associated with the user interface) to execute/re-execute a test 106. In response, the testing system 100 can initiate the test 106, accordingly, at (720).

Figure 8:
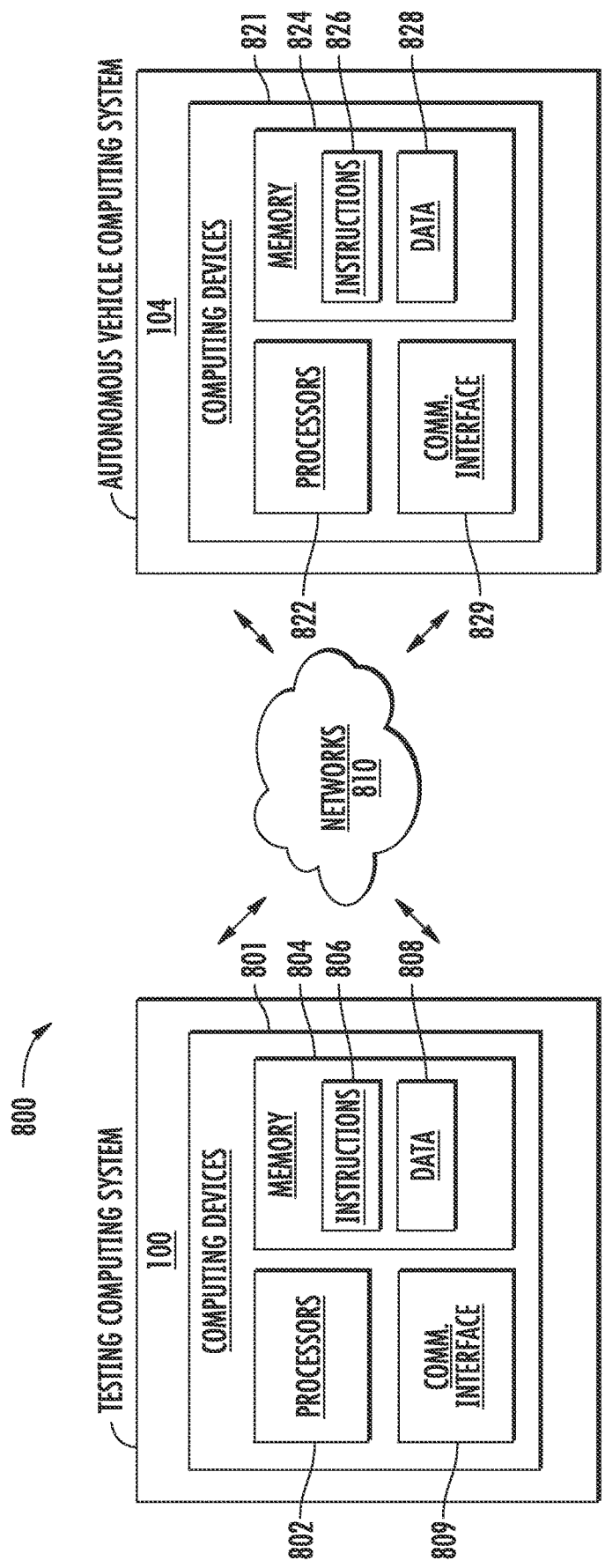
FIG. 8 depicts example system components according to example embodiments of the present disclosure.

FIG. 8 depicts an example system 800 according to example embodiments of the present disclosure. The example system 800 illustrated in FIG. 8 is provided as an example only. The components, systems, connections, and/or other aspects illustrated in FIG. 8 are optional and are provided as examples of what is possible, but not required, to implement the present disclosure. The example system 800 include the testing computing system 100 and the autonomous vehicle computing system 104 that can be communicatively coupled to one another over one or more network(s) 810.

The computing device(s) 801 of the testing computing system 100 can include processor(s) 802 and a memory 804. The one or more processors 802 can be any suitable processing device (e.g., a processor core, a microprocessor, an ASIC, a FPGA, a controller, a microcontroller, etc.) and can be one processor or a plurality of processors that are operatively connected. The memory 804 can include one or more non-transitory computer-readable storage media, such as RAM, ROM, EEPROM, EPROM, one or more memory devices, flash memory devices, data registrar, etc., and combinations thereof.

The memory 804 can store information that can be accessed by the one or more processors 802. For instance, the memory 804 (e.g., one or more non-transitory computer-readable storage mediums, memory devices) can include computer-readable instructions 806 that can be executed by the one or more processors 802. The instructions 806 can be software written in any suitable programming language or can be implemented in hardware. Additionally, or alternatively, the instructions 806 can be executed in logically and/or virtually separate threads on processor(s) 802.

For example, the memory 804 can store instructions 806 that when executed by the one or more processors 802 cause the one or more processors 802 (the testing computing system 100) to perform operations such as any of the operations and functions of the testing computing system 100, the operations and functions for autonomous vehicle testing (e.g., one or more portions of method 700), any of the operations and functions for which the testing computing system 100 is configured, and/or any other operations and functions of the testing computing system 100, as described herein.

The memory 804 can store data 808 that can be obtained (e.g., received, accessed, written, manipulated, created, generated, etc.) and/or stored. The data 808 can include, for instance, data indicative of one or more tests, data indicative of one or more testing scenarios, data indicative of one or more autonomous vehicle capabilities, real-world data, test result data, feedback data, data indicative of label(s), data indicative of user interface(s), data indicative of user input, and/or other data/information as described herein. In some implementations, the computing device(s) 801 can obtain data from one or more memories that are remote from the testing system 100.

The computing device(s) 801 can also include a communication interface 809 used to communicate with one or more other system(s) (e.g., the autonomous vehicle computing system 104). The communication interface 809 can include any circuits, components, software, etc. for communicating via one or more networks (e.g., network(s) 810). In some implementations, the communication interface 809 can include, for example, one or more of a communications controller, receiver, transceiver, transmitter, port, conductors, software and/or hardware for communicating data.

The autonomous vehicle computing system 104 can include one or more computing device(s) 821. The computing device(s) 821 can include one or more processors 822 and a memory 824. The one or more processors 822 can be any suitable processing device (e.g., a processor core, a microprocessor, an ASIC, a FPGA, a controller, a microcontroller, etc.) and can be one processor or a plurality of processors that are operatively connected. The memory 824 can include one or more tangible, non-transitory computer-readable storage media, such as RAM, ROM, EEPROM, EPROM, one or more memory devices, flash memory devices, data registrar, etc., and combinations thereof.

The memory 824 can store information that can be accessed by the one or more processors 822. For instance, the memory 824 (e.g., one or more tangible, non-transitory computer-readable storage media, one or more memory devices, etc.) can include computer-readable instructions 826 that can be executed by the one or more processors 822. The instructions 826 can be software written in any suitable programming language or can be implemented in hardware. Additionally, or alternatively, the instructions 826 can be executed in logically and/or virtually separate threads on processor(s) 822.

For example, the memory 824 can store instructions 826 that when executed by the one or more processors 822 cause the one or more processors 822 to perform operations such as any of the operations and functions of the autonomous vehicle computing system 104 or for which the autonomous vehicle computing system 104 is configured, as described herein, and/or any other operations and functions described herein.

The memory 824 can store data 828 that can be obtained and/or stored. The data 828 can include, for instance, sensor data, perception data, prediction data, motion planning data, driving log data, and/or other data/information as described herein. In some implementations, the computing device(s) 821 can obtain data from one or more memories that are remote from the autonomous vehicle computing system 104.

The computing device(s) 821 can also include a communication interface 829 used to communicate with one or more other system(s) (e.g., the simulation computing system 102, the test management computing system 118, etc.). The communication interface 829 can include any circuits, components, software, etc. for communicating via one or more networks (e.g., network(s) 810). In some implementations, the communication interface 829 can include, for example, one or more of a communications controller, receiver, transceiver, transmitter, port, conductors, software and/or hardware for communicating data.

The network(s) 810 can be any type of network or combination of networks that allows for communication between devices. In some embodiments, the network(s) 810 can include one or more of a local area network, wide area network, the Internet, secure network, cellular network, mesh network, peer-to-peer communication link and/or some combination thereof and can include any number of wired or wireless links. Communication over the network(s) 810 can be accomplished, for instance, via a communication interface using any type of protocol, protection scheme, encoding, format, packaging, etc.

Computing tasks discussed herein as being performed at computing device(s) of one system can instead be performed at another system, or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks and/or operations can be performed sequentially or in parallel. Data and instructions can be stored in a single memory device or across multiple memory devices.

While the present subject matter has been described in detail with respect to specific example embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computing system for autonomous vehicle testing, comprising:
   one or more processors; and
   one or more tangible, non-transitory, computer readable media that store instructions that when executed by the one or more processors cause the computing system to perform operations comprising:
   receiving testing data indicative of a test of an autonomous vehicle computing system by a simulation computing system, wherein the test is associated with a plurality of testing parameters;
   determining a testing scenario that corresponds to the test based on the plurality of testing parameters;

determining one or more autonomous vehicle capabilities corresponding to the test or the testing scenario;
generating an associated data structure comprising a linked association among the test of the autonomous vehicle computing system, the testing scenario, and the one or more autonomous vehicle capabilities;
receiving a query indicative of the test of the autonomous vehicle computing system, the testing scenario, or at least one of the one or more autonomous vehicle capabilities;
in response to the query and based on the associated data structure, providing, from a searchable database storing the associated data structure, data indicative of the test of the autonomous vehicle computing system, the testing scenario, and the one or more autonomous vehicle capabilities; and
providing, for access by the simulation computing system for testing of the autonomous vehicle computing system, at least the test scenario, wherein the autonomous vehicle computing system is configured to control a simulated autonomous vehicle within a simulated environment generated based on the test scenario and provide, to the computing system, feedback data indicative of a performance of the autonomous vehicle computing system.

2. The computing system of claim 1, wherein the plurality of testing parameters are indicative of at least one of a geographic environment associated with the test, one or more features of the geographic environment associated with the test, one or more objects within the geographic environment, or one or more weather conditions.

3. The computing system of claim 2, wherein the test is associated with one or more variations of the plurality of testing parameters.

4. The computing system of claim 1, wherein the operations further comprise:
obtaining test result data associated with the test, wherein the test result data is based at least in part on the feedback data from the autonomous vehicle computing system;
associating the test result data with the associated data structure that associates the test of the autonomous vehicle computing system with the testing scenario and the one or more autonomous vehicle capabilities; and
in response to the query and based on the associated data structure, providing the test results data associated with the test.

5. The computing system of claim 4, wherein the feedback data comprises at least one of perception data, prediction data, or motion planning data generated by the autonomous vehicle computing system during the test.

6. The computing system of claim 4, wherein the operations further comprise:
determining a performance metric associated with the autonomous vehicle computing system based on the test result data, the performance metric comprising a score that is indicative of a performance of the autonomous vehicle computing system with respect to the test.

7. The computing system of claim 1, wherein the operations further comprise:
receiving one or more testing labels for the test;
associating the one or more testing labels with the associated data structure that associates the test of the autonomous vehicle computing system with the testing scenario and the one or more autonomous vehicle capabilities; and
in response to the query and based on the associated data structure, providing the one or more testing labels for the test.

8. The computing system of claim 7, wherein the query is indicative of at least one of the one or more testing labels.

9. The computing system of claim 7, wherein the one or more testing labels are indicative of an applicability of the test to a software version associated with autonomous vehicle computing system.

10. The computing system of claim 7, wherein the operations further comprise:
promoting the test based on the one or more testing labels.

11. The computing system of claim 7, wherein the one or more testing labels are indicative of a soundness of the test.

12. A computer-implemented method, comprising:
receiving testing data indicative of a test of an autonomous vehicle computing system by a simulation computing system, wherein the test is associated with a plurality of testing parameters;
determining a testing scenario that corresponds to the test based on the plurality of testing parameters;
determining one or more autonomous vehicle capabilities corresponding to the test or the testing scenario;
generating an associated data structure comprising a linked association between-among the test of the autonomous vehicle computing system, the testing scenario, and the one or more autonomous vehicle capabilities;
receiving a query indicative of the test of the autonomous vehicle computing system, the testing scenario, or at least one of the one or more autonomous vehicle capabilities;
in response to the query and based on the associated data structure, providing, from a searchable database storing the associated data structure, data indicative of the test of the autonomous vehicle computing system, the testing scenario, and the one or more autonomous vehicle capabilities; and
providing, for access by the simulation computing system for testing of the autonomous vehicle computing system, at least the test scenario, wherein the autonomous vehicle computing system is configured to control a simulated autonomous vehicle within a simulated environment generated based on the test scenario and provide feedback data indicative of a performance of the autonomous vehicle computing system.

13. The computer-implemented method of claim 12, wherein the plurality of testing parameters are indicative of at least one of a geographic environment associated with the test, one or more features of the geographic environment associated with the test, one or more objects within the geographic environment, or one or more weather conditions.

14. The computer-implemented method of claim 13, wherein the test is associated with one or more variations of the plurality of testing parameters.

15. One or more tangible, non-transitory computer-readable media storing computer-readable instructions that when executed by one or more processors cause the one or more processors to perform operations comprising:
receiving testing data indicative of a test of an autonomous vehicle computing system by a simulation computing system, wherein the test is associated with a plurality of testing parameters;
determining a testing scenario that corresponds to the test based on the plurality of testing parameters;
determining one or more autonomous vehicle capabilities corresponding to the test or the testing scenario;

generating an associated data structure comprising a linked association among the test of the autonomous vehicle computing system, the testing scenario, and the one or more autonomous vehicle capabilities;

receiving a query indicative of the test of the autonomous vehicle computing system, the testing scenario, or at least one of the one or more autonomous vehicle capabilities;

in response to the query and based on the associated data structure, providing, from a searchable database storing the associated data structure, data indicative of the test of the autonomous vehicle computing system, the testing scenario, and the one or more autonomous vehicle capabilities; and providing, for access by the simulation computing system for testing of the autonomous vehicle computing system, least the test scenario, wherein the autonomous vehicle computing system is configured to control a simulated autonomous vehicle within a simulated environment generated based on the test scenario and provide, to the one or more processors, feedback data indicative of a performance of the autonomous vehicle computing system.

16. The one or more tangible, non-transitory computer-readable media of claim 15, wherein the operations further comprise:

receiving one or more testing labels for the test;

associating the one or more testing labels with the associated data structure that associates the test of the autonomous vehicle computing system with the testing scenario and the one or more autonomous vehicle capabilities; and in response to the query and based on the associated data structure, providing the one or more testing labels for the test.

17. The one or more tangible, non-transitory computer-readable media of claim 15, wherein the operations further comprise:

obtaining test result data associated with the test, wherein the test result data is based at least in part on the feedback data from the autonomous vehicle computing system;

associating the test result data with the associated data structure that associates the test of the autonomous vehicle computing system with the testing scenario and the one or more autonomous vehicle capabilities; and in response to the query and based on the associated data structure, providing the test results data associated with the test.

18. The one or more tangible, non-transitory computer-readable media of claim 17, wherein the feedback data comprises at least one of perception data, prediction data, or motion planning data generated by the autonomous vehicle computing system during the test.

19. The one or more tangible, non-transitory computer-readable media of claim 17, wherein the operations further comprise:

determining a performance metric associated with the autonomous vehicle computing system based on the test result data, the performance metric comprising a score that is indicative of a performance of the autonomous vehicle computing system with respect to the test.

20. The one or more tangible, non-transitory computer-readable media of claim 19, wherein the operations further comprise:

receiving one or more testing labels for the test, wherein the one or more testing labels are associated with the test result data;

associating the one or more testing labels with the associated data structure that associates the test of the autonomous vehicle computing system with the testing scenario and the one or more autonomous vehicle capabilities; and in response to the query and based on the associated data structure, providing the one or more testing labels for the test.

* * * * *